(12) United States Patent
Negley

(10) Patent No.: US 8,598,606 B2
(45) Date of Patent: *Dec. 3, 2013

(54) SOLID METAL BLOCK SEMICONDUCTOR LIGHT EMITTING DEVICE MOUNTING SUBSTRATES AND PACKAGES

(75) Inventor: Gerald H. Negley, Carrboro, NC (US)

(73) Assignee: Cree, Inc., Durham, NC (US)

(*) Notice: Subject to any disclaimer, the term of this patent is extended or adjusted under 35 U.S.C. 154(b) by 734 days.

This patent is subject to a terminal disclaimer.

(21) Appl. No.: 12/363,000

(22) Filed: Jan. 30, 2009

(65) Prior Publication Data
US 2009/0134421 A1   May 28, 2009

Related U.S. Application Data

(63) Continuation of application No. 10/972,910, filed on Oct. 25, 2004, now abandoned.

(51) Int. Cl.
*H01L 33/00* (2010.01)

(52) U.S. Cl.
USPC ........ 257/98; 257/99; 257/100; 257/E33.058; 257/E33.059; 257/E33.061; 257/E33.066; 257/E33.072; 257/E33.073; 257/E33.075

(58) Field of Classification Search
None
See application file for complete search history.

(56) References Cited

U.S. PATENT DOCUMENTS

| | | | |
|---|---|---|---|
| 4,042,552 A | 8/1977 | Grucza | |
| 4,107,238 A | 8/1978 | Roper et al. | |
| 4,141,941 A | 2/1979 | Travnicek | |
| 4,562,018 A | 12/1985 | Neefe | |
| 4,650,922 A | 3/1987 | McPherson | |
| 4,794,048 A | 12/1988 | Oboodi et al. | |
| 4,826,424 A | 5/1989 | Arai et al. | |
| 4,918,497 A | 4/1990 | Edmond | |
| 4,935,665 A * | 6/1990 | Murata | 313/500 |
| 4,966,862 A | 10/1990 | Edmond | |
| 5,024,966 A | 6/1991 | Dietrich et al. | |
| 5,027,168 A | 6/1991 | Edmond | |
| 5,087,949 A | 2/1992 | Haitz | |
| 5,110,278 A | 5/1992 | Tait et al. | |
| 5,143,660 A | 9/1992 | Hamilton et al. | |

(Continued)

FOREIGN PATENT DOCUMENTS

| | | |
|---|---|---|
| DE | 92 07 549.5 U1 | 8/1992 |
| DE | 102 33 050 A1 | 2/2004 |

(Continued)

OTHER PUBLICATIONS

Decision to refuse a European Patent application, EP Application No. 05770853.9, Dec. 22, 2009.

(Continued)

*Primary Examiner* — Hoang-Quan Ho
(74) *Attorney, Agent, or Firm* — Myers Bigel Sibley & Sajovec, P.A.

(57) ABSTRACT

A mounting substrate for a semiconductor light emitting device includes a solid metal block having first and second opposing metal faces. The first metal face includes an insulating layer and a conductive layer on the insulating layer. The conductive layer is patterned to provide first and second conductive traces that connect to a semiconductor light emitting device. The second metal face may include heat sink fins therein. A flexible film including an optical element, such as a lens, also may be provided, overlying the semiconductor light emitting device.

28 Claims, 14 Drawing Sheets

(56) References Cited

U.S. PATENT DOCUMENTS

| | | |
|---|---|---|
| 5,166,815 A | 11/1992 | Elderfield |
| 5,210,051 A | 5/1993 | Carter, Jr. |
| 5,277,840 A | 1/1994 | Osaka et al. |
| 5,298,768 A | 3/1994 | Okazaki et al. |
| 5,338,944 A | 8/1994 | Edmond et al. |
| 5,374,668 A | 12/1994 | Kanemura et al. |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |
| 5,631,190 A | 5/1997 | Negley |
| 5,669,486 A | 9/1997 | Shima |
| 5,739,554 A | 4/1998 | Edmond et al. |
| 5,753,730 A | 5/1998 | Nagata et al. |
| 5,813,753 A | 9/1998 | Vriens et al. |
| 5,851,063 A | 12/1998 | Doughty et al. |
| 5,857,767 A | 1/1999 | Hochstein |
| 5,858,278 A | 1/1999 | Itoh et al. |
| 5,882,553 A | 3/1999 | Prophet et al. |
| 5,912,477 A | 6/1999 | Negley |
| 5,959,316 A | 9/1999 | Lowery |
| 5,968,422 A | 10/1999 | Kennedy |
| 6,060,729 A | 5/2000 | Suzuki et al. |
| 6,066,861 A | 5/2000 | Höhn et al. |
| 6,069,440 A | 5/2000 | Shimizu et al. |
| 6,120,600 A | 9/2000 | Edmond et al. |
| 6,156,242 A | 12/2000 | Saito et al. |
| 6,177,688 B1 | 1/2001 | Linthicum et al. |
| 6,184,544 B1 | 2/2001 | Toda et al. |
| 6,187,606 B1 | 2/2001 | Edmond et al. |
| 6,201,262 B1 | 3/2001 | Edmond et al. |
| 6,219,223 B1 | 4/2001 | Kobayashi et al. |
| 6,234,648 B1 | 5/2001 | Börner et al. |
| 6,252,254 B1 | 6/2001 | Soules et al. |
| 6,329,676 B1 | 12/2001 | Takayama et al. |
| 6,346,973 B1 | 2/2002 | Shibamoto et al. |
| 6,373,188 B1 | 4/2002 | Johnson et al. |
| 6,383,417 B1 | 5/2002 | Paulson et al. |
| 6,391,231 B1 | 5/2002 | Evans et al. |
| 6,404,125 B1 | 6/2002 | Garbuzov et al. |
| 6,429,583 B1 | 8/2002 | Levinson et al. |
| 6,480,389 B1 | 11/2002 | Shie et al. |
| 6,498,355 B1 | 12/2002 | Harrah et al. |
| 6,521,915 B2 | 2/2003 | Odaki et al. |
| 6,522,065 B1 | 2/2003 | Srivastava et al. |
| 6,531,328 B1 | 3/2003 | Chen |
| 6,562,643 B2 | 5/2003 | Chen |
| 6,576,930 B2 | 6/2003 | Reeh et al. |
| 6,577,073 B2 | 6/2003 | Shimizu et al. |
| 6,599,768 B1 | 7/2003 | Chen |
| 6,639,356 B2 | 10/2003 | Chin |
| 6,686,609 B1 | 2/2004 | Sung |
| 6,707,069 B2 | 3/2004 | Song et al. |
| 6,734,465 B1 | 5/2004 | Taskar et al. |
| 6,744,077 B2 | 6/2004 | Trottier |
| 6,783,362 B2 | 8/2004 | Cao |
| 6,791,151 B2 | 9/2004 | Lin et al. |
| 6,817,735 B2 | 11/2004 | Shimizu et al. |
| 6,824,294 B2 | 11/2004 | Cao |
| 6,841,804 B1 | 1/2005 | Chen et al. |
| 6,853,131 B2 | 2/2005 | Srivastava et al. |
| 6,874,910 B2 * | 4/2005 | Sugimoto et al. ............ 362/294 |
| 6,885,033 B2 | 4/2005 | Andrews |
| 6,921,927 B2 | 7/2005 | Ng et al. |
| 7,005,667 B2 | 2/2006 | Chen et al. |
| 7,005,679 B2 | 2/2006 | Tarsa et al. |
| 7,029,935 B2 | 4/2006 | Negley et al. |
| 7,153,000 B2 * | 12/2006 | Park et al. .................... 362/268 |
| 7,183,587 B2 * | 2/2007 | Negley et al. ................. 257/99 |
| 7,213,940 B1 | 5/2007 | Van De Ven et al. |
| 7,252,408 B2 | 8/2007 | Mazzochette et al. |
| 7,259,403 B2 | 8/2007 | Shimizu et al. |
| 7,322,732 B2 | 1/2008 | Negley et al. |
| 7,357,546 B2 | 4/2008 | Ishida et al. |
| 7,482,638 B2 * | 1/2009 | Wall, Jr. ........................ 257/99 |
| 7,614,759 B2 | 11/2009 | Negley |
| 7,718,991 B2 | 5/2010 | Negley |
| 7,722,220 B2 | 5/2010 | Van de Ven et al. |
| 7,737,459 B2 | 6/2010 | Edmond et al. |
| 7,744,243 B2 | 6/2010 | Van de Ven et al. |
| 7,768,192 B2 | 8/2010 | Van de Ven et al. |
| 7,906,793 B2 * | 3/2011 | Negley ........................... 257/98 |
| 2002/0006044 A1 | 1/2002 | Harbers et al. |
| 2002/0015013 A1 | 2/2002 | Ragle |
| 2002/0123164 A1 | 9/2002 | Slater, Jr. et al. |
| 2002/0172354 A1 | 11/2002 | Nishi |
| 2003/0006418 A1 | 1/2003 | Emerson et al. |
| 2003/0006469 A1 | 1/2003 | Ellens et al. |
| 2003/0032212 A1 | 2/2003 | Wang et al. |
| 2003/0067264 A1 | 4/2003 | Takekuma |
| 2003/0080341 A1 | 5/2003 | Sakano et al. |
| 2003/0098459 A1 | 5/2003 | Horiuchi et al. |
| 2003/0128313 A1 | 7/2003 | Kaminsky et al. |
| 2003/0151361 A1 | 8/2003 | Ishizaka |
| 2003/0153861 A1 | 8/2003 | Royer |
| 2003/0173575 A1 | 9/2003 | Eisert et al. |
| 2003/0189829 A1 | 10/2003 | Shimizu et al. |
| 2003/0189830 A1 | 10/2003 | Sugimoto et al. |
| 2004/0041222 A1 | 3/2004 | Loh |
| 2004/0041757 A1 | 3/2004 | Yang et al. |
| 2004/0056260 A1 | 3/2004 | Slater, Jr. et al. |
| 2004/0065894 A1 | 4/2004 | Hashimoto et al. |
| 2004/0066556 A1 | 4/2004 | Dontula et al. |
| 2004/0079957 A1 | 4/2004 | Andrews et al. |
| 2004/0095738 A1 | 5/2004 | Juang |
| 2004/0105264 A1 | 6/2004 | Spero |
| 2004/0120155 A1 | 6/2004 | Suenaga |
| 2004/0124429 A1 * | 7/2004 | Stokes et al. ................... 257/98 |
| 2004/0144365 A1 | 7/2004 | Ouderkirk et al. |
| 2004/0190304 A1 | 9/2004 | Sugimoto et al. |
| 2004/0211970 A1 | 10/2004 | Hayashimoto et al. |
| 2004/0222433 A1 * | 11/2004 | Mazzochette et al. .......... 257/99 |
| 2004/0253427 A1 | 12/2004 | Yokogawa et al. |
| 2004/0257797 A1 | 12/2004 | Suchiro et al. |
| 2004/0264212 A1 | 12/2004 | Chung et al. |
| 2005/0023551 A1 * | 2/2005 | Mizuyoshi ..................... 257/99 |
| 2005/0051782 A1 * | 3/2005 | Negley et al. .................. 257/79 |
| 2005/0051789 A1 * | 3/2005 | Negley et al. .................. 257/99 |
| 2005/0062059 A1 * | 3/2005 | Huang ........................... 257/100 |
| 2005/0073846 A1 | 4/2005 | Takine |
| 2005/0082974 A1 | 4/2005 | Fukasawa et al. |
| 2005/0224830 A1 * | 10/2005 | Blonder et al. ................ 257/100 |
| 2006/0065957 A1 | 3/2006 | Hanya |
| 2006/0097385 A1 | 5/2006 | Negley |
| 2006/0124953 A1 | 6/2006 | Negley et al. |
| 2006/0138937 A1 | 6/2006 | Ibbetson |
| 2006/0261366 A1 | 11/2006 | Yang |
| 2007/0018181 A1 | 1/2007 | Steen et al. |
| 2007/0137074 A1 | 6/2007 | Van de Ven et al. |
| 2007/0139923 A1 | 6/2007 | Negley et al. |
| 2007/0170447 A1 | 7/2007 | Negley et al. |
| 2007/0171145 A1 | 7/2007 | Coleman et al. |
| 2007/0223219 A1 | 9/2007 | Medendorp, Jr. et al. |
| 2007/0267983 A1 | 11/2007 | Van de Ven et al. |
| 2007/0274080 A1 | 11/2007 | Negley et al. |
| 2007/0278503 A1 | 12/2007 | Van de Ven et al. |
| 2007/0278934 A1 | 12/2007 | Van de Ven et al. |
| 2007/0278974 A1 | 12/2007 | Van de Ven |
| 2007/0279440 A1 | 12/2007 | Negley |
| 2007/0280624 A1 | 12/2007 | Negley et al. |
| 2008/0084685 A1 | 4/2008 | Van de Ven et al. |
| 2008/0084700 A1 | 4/2008 | Van de Ven |
| 2008/0084701 A1 | 4/2008 | Van de Ven et al. |
| 2008/0089053 A1 | 4/2008 | Negley |
| 2008/0106895 A1 | 5/2008 | Van de Ven et al. |
| 2008/0130265 A1 | 6/2008 | Negley et al. |
| 2008/0130285 A1 | 6/2008 | Negley et al. |
| 2008/0136313 A1 | 6/2008 | Van de Ven et al. |
| 2008/0231201 A1 | 9/2008 | Higley et al. |
| 2008/0259589 A1 | 10/2008 | Van de Ven |
| 2008/0278928 A1 | 11/2008 | Van de Ven et al. |
| 2008/0278940 A1 | 11/2008 | Van de Ven et al. |
| 2008/0304260 A1 | 12/2008 | Van de Ven et al. |
| 2008/0304261 A1 | 12/2008 | Van de Ven et al. |

(56) References Cited

U.S. PATENT DOCUMENTS

| | | | |
|---|---|---|---|
| 2009/0134421 A1* | 5/2009 | Negley | 257/98 |
| 2009/0161356 A1 | 6/2009 | Negley et al. | |
| 2009/0184616 A1 | 7/2009 | Van de Ven et al. | |
| 2009/0246895 A1 | 10/2009 | You et al. | |
| 2011/0210360 A1 | 9/2011 | Negley et al. | |

FOREIGN PATENT DOCUMENTS

| | | |
|---|---|---|
| EP | 0 439 227 A1 | 7/1991 |
| EP | 1 045 458 A2 | 10/2000 |
| EP | 1 059 667 A2 | 12/2000 |
| EP | 1 139 439 A1 | 10/2001 |
| EP | 1 502 752 A2 | 2/2005 |
| GB | 2 361 581 A | 10/2001 |
| GB | 2 371 629 A | 7/2002 |
| JP | 1-100175 | 7/1989 |
| JP | 2-185076 A | 7/1990 |
| JP | 4-159519 A | 6/1992 |
| JP | 5-152609 A | 6/1993 |
| JP | 6-151974 A | 5/1994 |
| JP | 6-177429 A | 6/1994 |
| JP | 6-244458 A | 9/1994 |
| JP | 6-305193 A | 11/1994 |
| JP | 6-334167 A | 12/1994 |
| JP | 08-116095 A | 5/1996 |
| JP | 8-156325 A | 6/1996 |
| JP | 8-162676 A | 6/1996 |
| JP | 09-083018 A | 3/1997 |
| JP | 9-146089 A | 6/1997 |
| JP | 9-246603 A | 9/1997 |
| JP | 9-293904 A | 11/1997 |
| JP | 10-98215 A | 4/1998 |
| JP | 10-098215 A | 4/1998 |
| JP | 10-242513 A | 9/1998 |
| JP | 11-261114 A | 9/1999 |
| JP | 11-298047 A | 10/1999 |
| JP | 2000-101147 A | 4/2000 |
| JP | 2000-174347 A | 6/2000 |
| JP | 2000-183405 A | 6/2000 |
| JP | 2000-286455 A | 10/2000 |
| JP | 2000-286458 A | 10/2000 |
| JP | 2000-353826 A | 12/2000 |
| JP | 2000-353827 A | 12/2000 |
| JP | 2001-77427 A | 3/2001 |
| JP | 2001-77433 A | 3/2001 |
| JP | 2001-144334 A | 5/2001 |
| JP | 2001-230453 A | 8/2001 |
| JP | 2002-118293 A | 4/2002 |
| JP | 2002-158378 A | 5/2002 |
| JP | 2002-223004 A | 8/2002 |
| JP | 2002-280616 A | 9/2002 |
| JP | 2003-17755 A | 1/2003 |
| JP | 2003-031914 A | 1/2003 |
| JP | 2003-051620 A | 2/2003 |
| JP | 2003-77318 A | 3/2003 |
| JP | 2003-101076 A | 4/2003 |
| JP | 2003-110146 A | 4/2003 |
| JP | 2003-152226 A | 5/2003 |
| JP | 2003-243718 A | 8/2003 |
| JP | 2003243718 * | 8/2003 |
| JP | 2003-303999 A | 10/2003 |
| JP | 2003-318448 A | 11/2003 |
| JP | 2004-080046 | 3/2004 |
| JP | 2004-288788 A | 10/2004 |
| WO | WO 97/24706 A2 | 7/1997 |
| WO | WO 97/24706 A3 | 7/1997 |
| WO | WO 01/43113 A1 | 6/2001 |
| WO | WO 01/61764 A1 | 8/2001 |
| WO | WO 02/059982 A1 | 8/2002 |
| WO | WO 03/030274 A1 | 4/2003 |
| WO | WO03030274 A1 * | 4/2003 |
| WO | WO 03/056876 A2 | 7/2003 |
| WO | WO 03/056876 A3 | 7/2003 |
| WO | WO 03/091771 A | 11/2003 |
| WO | WO 2005/104252 A2 | 11/2005 |

OTHER PUBLICATIONS

Provision of the minutes in accordance with Rule 124(4) EPC, including Minutes of the oral proceedings before the Examining Division, EP Application No. 05770853.9, Dec. 18, 2009.

Aavid Thermalloy, LLC, *Extrusion Profiles*, retrieved Oct. 18, 2004 from http://www.aavidthermalloy.com/products/extrusion/index.shtml.

Andrews, *Methods for Packaging a Light Emitting Devices*, U.S. Appl. No. 60/557,924, filed Mar. 31, 2004.

Andrews, *Reflector Packages and Methods for Packaging of a Semiconductor Light Emitting Devices*, U.S. Appl. No. 60/558,314, filed Mar. 31, 2004.

Cabot Corporation, *Using Nanogel in Daylighting Systems*, retrieved Jan. 11, 2005 from http://w1.cabot-corp.com/Controller.jsp . . . .

Craford, *Overview of Device Issues in High-Brightness Light-Emitting Diodes*, Chapter, *High Brightness Light Emitting Diodes: Semiconductors and Semimetals*, vol. 48, Stringfellow et al. ed., Academic Press, 1997, pp. 47-63.

Cree, Inc., *Cree Optoelectronics LED Product Line*, Publication CPR3AX, Rev. D, 2001-2002.

Heatron, *ELPOR® Product Information*, retrieved Oct. 6, 2004 from http://www.heatron.com.

Heatron, *Metal Core PCBs for LED Light Engines* (Product Brochure), retrieved from http://www.heatron.com.

International Search Report, PCT/US03/27912, Jan. 30, 2004.

IRC Advanced Film Division, *Insulated Aluminum Substrates* (Product Brochure) retrieved from http://www.irctt.com, copyright 2002.

IRC Advanced Film Division, *Thick Film Application Specific Capabilities* (Product Brochure), retrieved from http://www.irctt.com, copyright 2002.

Loh, *Power Surface Mount Light Emitting Die Package*, U.S. Appl. No. 10/446,532, filed May 27, 2003.

Morris, *IRC's Anotherm™ PC Boards Eliminate Heat for Automotive LED Applications*, Mar. 16, 2004 Press Release, retrieved Sep. 17, 2004 from http://www.irctt.com/pages/Anotherm_PressRelease.cfm.

Negley et al., *Light Emitting Diode Arrays for Direct Backlighting of Liquid Crystal Displays*, U.S. Appl. No. 11/022,332, filed Dec. 23, 2004.

Negley et al., *Methods of Coating Semiconductor Light Emitting Elements by Evaporating Solvent From a Suspension*, U.S. Appl. No. 10/946,587, filed Sep. 21, 2004.

Negley et al., *Solid Block Mounting Substrates for Semiconductor Light Emitting Devices and Oxidizing Methods for Fabricating Same*, U.S. Appl. No. 10/659,108, filed Sep. 9, 2003.

Negley et al., *Solid Colloidal Dispersions for Backlighting of Liquid Crystal Displays*, U.S. Serial No. Unknown, filed Jan. 12, 2005.

Negley et al., *Transmissive Optical Elements Including Transparent Plastic Shell Having a Phosphor Dispersed Therein, and Methods of Fabricating Same*, U.S. Appl. No. 10/659,240, filed Sep. 9, 2003.

Negley, *Reflective Optical Elements for Semiconductor Light Emitting Devices*, U.S. Appl. No. 10/898,608, filed Jul. 23, 2004.

Negley, *Semiconductor Light Emitting Device Mounting Substrates and Packages Including Cavities and Cover Plates, and Methods of Packaging Same*, U.S. Appl. No. 11/011,748, filed Dec. 14, 2004.

Negley, *Semiconductor Light Emitting Devices Including Patternable Films Comprising Transparent Silicone and Phosphor, and Methods of Manufacturing Same*, U.S. Appl. No. 10/947,704, filed Sep. 23, 2004.

Notification of Transmittal of the International Search Report and the Written Opinion of the International Searching Authority, or the Declaration, International Search Report and Written Opinion of the International Searching Authority, PCT/US2004/017325, Sep. 28, 2004.

Slater, Jr. et al., *Phosphor-Coated Light Emitting Diodes Including Tapered Sidewalls and Fabrication Methods Therefor*, U.S. Appl. No. 60/411,980, filed Sep. 19, 2002.

(56) References Cited

OTHER PUBLICATIONS

"Notification of Transmittal of the International Search Report and the Written Opinion of the International Searching Authority, or the Declaration", "Written Opinion of the International Searching.Authority" and "International Search Report", PCT/2004/017326, Jul. 14, 2005.

Notification of Transmittal of the International Search Report and the Written Opinion of the International Searching Authority, or the Declaration, International Search Report, and Written Opinion of the International Searching Authority, PCT International Application No. PCT/US2005/023873, May 8, 2006.

Notification of Transmittal of the International Search Report and the Written Opinion of the International Searching Authority, or the Declaration, International Search Report, and Written Opinion of the International Searching Authority, PCT International Application No. PCT/US2005/044805, May 9, 2006.

Notification of Transmittal of the International Search Report and the Written Opinion of the International Searching Authority, or the Declaration, International Search Report, and Written Opinion of the International Searching Authority, PCT International Application No. PCT/US2006/000414, May 8, 2006.

Notification of Transmittal of the International Search Report and the Written Opinion of the International Searching Authority, or the Declaration, International Search Report, and Written Opinion of the International Searching Authority, PCT International Application No. PCT/US2006/002117, May 30, 2006.

Notification of Transmittal of the International Search Report and the Written Opinion of the International Searching Authority, or the Declaration, International Search Report, and Written Opinion of the International Searching Authority, PCT International Application No. PCT/US2005/043719, May 26, 2006.

U.S. Appl. No. 11/751,982, filed May 22, 2007, Negley.

U.S. Appl. No. 11/755,153, filed May 30, 2007, Negley.

Van de Ven et al., "Warm White Illumination with High CRI and High Efficacy by combining 455nm Excited Yellowish Phosphor LEDs and Red AlInGaP LEDs", First International Conference on White LEDs and Solid State Lighting (Nov. 26-30, 2007).

Shimizu, "Development of High-Efficiency LED Downlight", First International Conference on White LEDs and Solid State Lighting (Nov. 26-30, 2007).

Press Release: "LED Lighting Fixtures Creates 750 Lumen Recessed Light and Uses Only 16 Watts of Power", CREE LED Lighting Solutions, http://www.creells.com/PressRelease.aspx?ID=5 (Jan. 26, 2006).

Press Release: "LED Lighting Fixtures, Inc. Announces Record Performance", CREE LED Lighting Solutions, http://www.creells.com/PressRelease.aspx?ID=7 (Feb. 16, 2006).

Press Release: "LED Lighting Fixtures, Inc. Achieves Unprecedented Gain in Light Output from New Luminaire", CREE LED Lighting Solutions, http://www.creells.com/PressRelease.aspx?ID=11 (Apr. 24, 2006).

Press Release: "LED Lighting Fixtures, Inc. Announces its First LED-Based Recessed Down Light", CREE LED Lighting Solutions, http://www.creells.com/PressRelease.aspx?ID=6(Feb. 7, 2007).

Press Release: "LED Lighting Fixtures to Expand Product Line", CREE LED Lighting Solutions, http://www.creells.com/PressRelease.aspx?ID=1 (May 4, 2007).

Press Release: "New Lamp from LED Lighting Fixtures Shatters World Record for Energy Efficiency", CREE LED Lighting Solutions, http://www.creells.com/PressRelease.aspx?ID=22 (Nov. 28, 2007).

Press Release: "LED Lighting Fixtures, Inc. Sets World Record at 80 Lumens per Watt for Warm White Fixture", LED Lighting Fixtures, Inc. (May 30, 2006).

"Test Data Report", CSA International, Project No. 1786317, Report No. 1786317-1, 15 pages (Apr. 2006).

"LED Lighting Fixtures, Inc. Sets World Record at 80 Lumens Per Watt for Warm White", http://www.compoundsemi.com/documents/articles/cldoc/6802.html, Compound Semiconductors Online, Last Downloaded: Aug. 8, 2006.

"Product Test Reference: CALiPER 07-31 Downlight Lamp", DOE SSL CALIPER Report (Sep. 2007).

"Product Test Reference: CALiPER 07-47 Downlight Lamp", DOE SSL CALIPER Report (Sep. 2007).

"DOE Solid-State Lighting CALiPER Program, Summary of Results: Round 3 of Product Testing", U.S. Department of Energy (Oct. 2007).

DOE Solid-State Lighting CALiPER Program, Summary of Results: Round 4 of Product Testing (Jan. 2008).

"DOE Solid-State Lighting CALiPER Program, Summary of Results: Round 5 of Product Testing", U.S. Department of Energy (May 2008).

$2^{nd}$ Written Opinion (7 pages) corresponding to International Application No. PCT/US07/12159; Mailing Date: Aug. 7, 2008.

International Search Report and Written Opinion (10 pages) corresponding to International Application No. PCT/US07/12159; Mailing Date: Feb. 27, 2008.

International Search Report and Written Opinion (14 pages) corresponding to International Application No. PCT/US07/12706; Mailing Date: Jul. 3, 2008.

EPO Communication including European Search Report, EPO Application No. 09177126.1, Feb. 18, 2010.

Summons to attend oral proceedings pursuant to Rule 115(1) EPC, Apr. 2, 2009.

Communication pursuant to Article 94(3) EPC, European Patent Application No. 09 177 126.1, Apr. 14, 2001.

Korean Notice of Final Rejection Corresponding to Korean Application No. 10-2007-7009221; Dated: Jul. 31, 2012; Foreign Text, 4 pages, English Translation Thereof, 3 Pages.

Decision of Rejection and English translation thereof, JP Application No. 2007-538890, Aug. 12, 2011.

Japanese Office Action Corresponding to Japanese Patent Application No. 2011-270840; Date Mailed: Nov. 27, 2012; 4 Pages (Foreign Text Only).

Japanese Rejection from Appeal Board Corresponding to Japanese Patent Application No. 2011-270840; Dated: Sep. 28, 2012; 8 Pages.

Japanese Decision of Rejection Corresponding to Japanese Patent Application No. 2011-270840; Mailing Date Jul. 5, 2013; Foreign Text, 3 Pages, English Translation Thereof, 3 Pages.

* cited by examiner

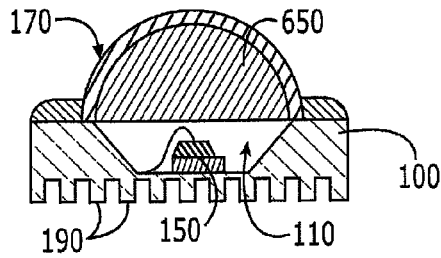
FIG. 7
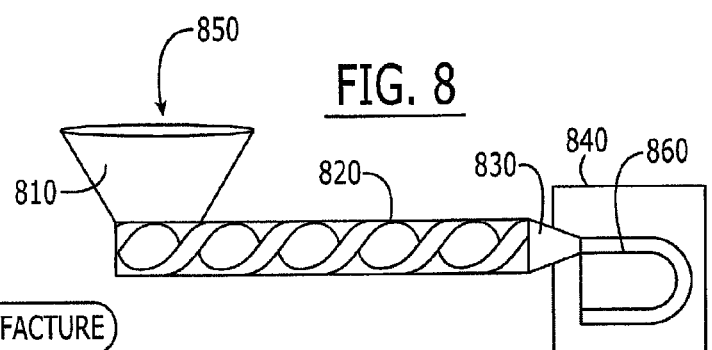
FIG. 8
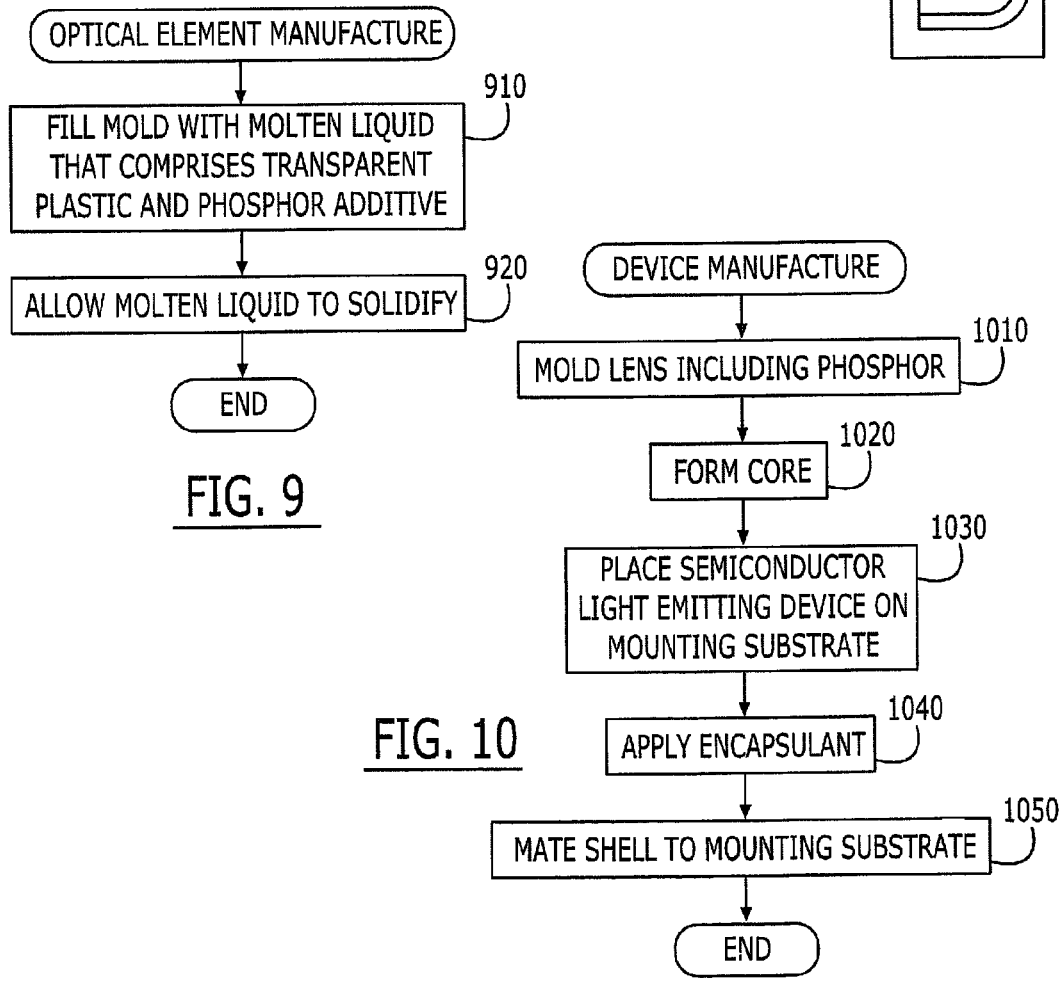
FIG. 9
FIG. 10

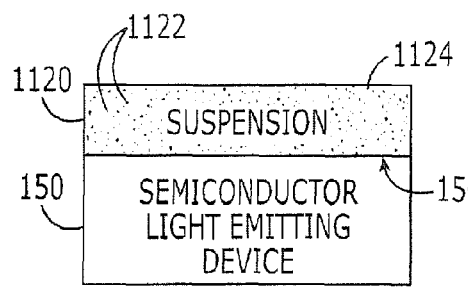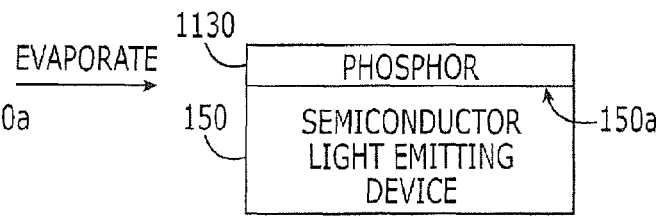
FIG. 11A    FIG. 11B
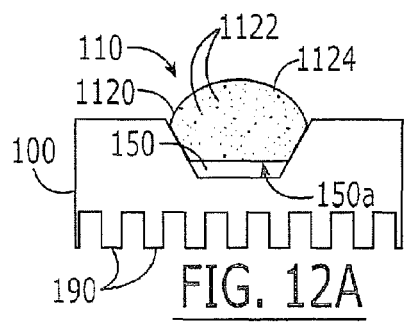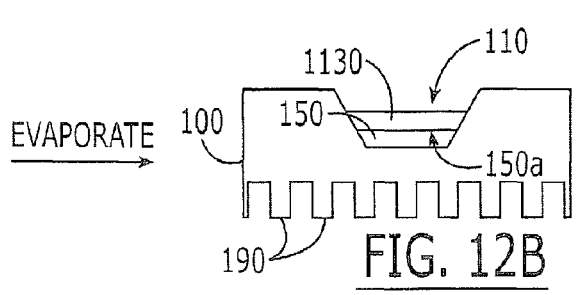
FIG. 12A    FIG. 12B
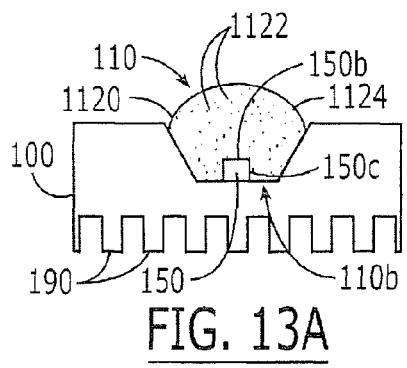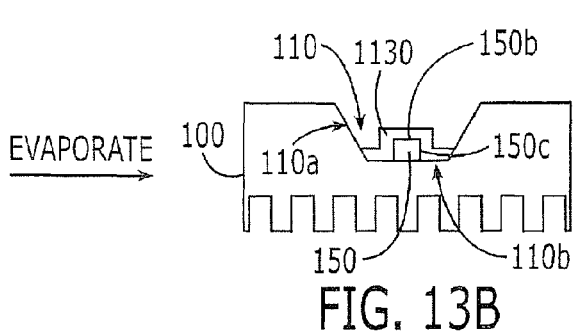
FIG. 13A    FIG. 13B

SOLID METAL BLOCK SEMICONDUCTOR LIGHT EMITTING DEVICE MOUNTING SUBSTRATES AND PACKAGES

CROSS-REFERENCE TO RELATED APPLICATION

This application is a continuation of application Ser. No. 10/972,910, filed Oct. 25, 2004, now abandoned entitled Solid Metal Block Semiconductor Light Emitting Device Mounting Substrates and Packages Including Cavities and Heat Sinks, assigned to the assignee of the present application, the disclosure of which is hereby incorporated herein by reference in its entirety as if set forth fully herein.

FIELD OF THE INVENTION

This invention relates to semiconductor light emitting devices and manufacturing methods therefor, and more particularly to packaging and packaging methods for semiconductor light emitting devices.

BACKGROUND OF THE INVENTION

Semiconductor light emitting devices, such as Light Emitting Diodes (LEDs) or laser diodes, are widely used for many applications. As is well known to those having skill in the art, a semiconductor light emitting device includes one or more semiconductor layers that are configured to emit coherent and/or incoherent light upon energization thereof. It is also known that the semiconductor light emitting device generally is packaged to provide external electrical connections, heat sinking, lenses or waveguides, environmental protection and/or other functions.

For example, it is known to provide a two-piece package for a semiconductor light emitting device, wherein the semiconductor light emitting device is mounted on a substrate that comprises alumina, aluminum nitride and/or other materials, which include electrical traces thereon, to provide external connections for the semiconductor light emitting device. A second substrate which may comprise silver plated copper, is mounted on the first substrate, for example using glue, surrounding the semiconductor light emitting device. A lens may be placed on the second substrate over the semiconductor light emitting device. Light emitting diodes with two-piece packages as described above are described in Application Serial No. US 2004/0041222 A1 to Loh, entitled Power Surface Mount Light Emitting Die Package, published Mar. 4, 2004, assigned to the assignee of the present invention, the disclosure of which is hereby incorporated herein by reference in its entirety as if set forth fully herein.

SUMMARY OF THE INVENTION

Some embodiments of the present invention provide a mounting substrate for a semiconductor light emitting device that includes a solid metal block having first and second opposing metal faces. The first metal face includes therein a cavity that is configured to mount at least one semiconductor light emitting device therein and to reflect light that is emitted by at least one semiconductor light emitting device that is mounted therein away from the cavity. The second metal face includes therein a plurality of heat sink fins.

In some embodiments, a reflective coating is provided in the cavity. In other embodiments, first and second conductive traces are provided in the cavity that are configured to connect to at least one semiconductor light emitting device that is mounted in the cavity. In yet other embodiments, an insulating layer is provided on the first metal face, and a conductive layer is provided on the insulating layer that is patterned to provide the reflective coating in the cavity and the first and second conductive traces in the cavity. The solid metal block can be a solid aluminum block with an aluminum oxide insulating layer. In other embodiments, the solid metal block is a solid steel block with a ceramic insulating layer.

In still other embodiments of the invention, the first metal face includes a pedestal therein, and the cavity is in the pedestal. In yet other embodiments, the solid metal block includes a through hole therein that extends from the first face to the second face. The through hole includes a conductive via therein that is electrically connected to the first or second conductive traces.

In some embodiments of the present invention, a semiconductor light emitting device is mounted in the cavity. In other embodiments, a lens extends across the cavity. In still other embodiments, when the cavity is in a pedestal, the lens extends across the pedestal and across the cavity. In still other embodiments, a flexible film that includes an optical element therein is provided on the first metal face, wherein the optical element extends across the cavity or extends across the pedestal and across the cavity. Accordingly, semiconductor light emitting device packages may be provided.

Phosphor also may also be provided according to various elements of the present invention. In some embodiments, a coating including phosphor is provided on the inner and/or outer surface of the lens or optical element. In other embodiments, the lens or optical element includes phosphor dispersed therein. In yet other embodiments, a phosphor coating is provided on the semiconductor light emitting device itself. Combinations of these embodiments also may be provided.

An integrated circuit also may be provided on the solid metal block that is electrically connected to the first and second traces. The integrated circuit may be a light emitting device driver integrated circuit. Finally, an optical coupling medium may be provided in the cavity and at least partially surrounding the light emitting device.

Other embodiments of the present invention provide a mounting substrate for an array of semiconductor light emitting devices. In these embodiments, the first metal face includes therein a plurality of cavities, a respective one of which is configured to mount at least one semiconductor light emitting device therein, and to reflect light that is emitted by the at least one semiconductor light emitting device that is mounted therein away from the respective cavity. The second metal face includes a plurality of heat sink fins. A reflective coating, conductive traces, an insulating layer, pedestals, through holes, lenses, flexible films, optical elements, phosphor, integrated circuits and/or optical coupling media also may be provided according to any of the embodiments that were described above, to provide semiconductor light emitting device packages. Moreover, the cavities may be uniformly and/or nonuniformly spaced apart from one another in the first face.

Semiconductor light emitting devices may be packaged according to some embodiments of the present invention by fabricating a solid metal block including one or more cavities in a first face thereof and a plurality of heat sink fins in a second face thereof, forming an insulating layer on the first face, forming a conductive layer and mounting a semiconductor light emitting device in at least one of the cavities. Pedestals, through holes, lenses, flexible films, optical elements, phosphor, integrated circuits and/or optical coupling media may be provided according to any of the embodiments that were described above.

BRIEF DESCRIPTION OF THE DRAWINGS

FIG. 7 is a cross-sectional view of a semiconductor light emitting device package according to other embodiments of the present invention.

FIG. 8 is a schematic diagram of a molding apparatus that may be used to fabricate optical elements according to embodiments of the present invention.

FIGS. 9 and 10 are flowcharts of steps that may be performed to package semiconductor light emitting devices according to various embodiments of the present invention.

FIGS. 11A and 11B, 12A and 12B, and 13A and 13B are cross-sectional views of semiconductor light emitting device packages during intermediate fabrication steps according to various embodiments of the present invention.

DETAILED DESCRIPTION

Figure 1A:
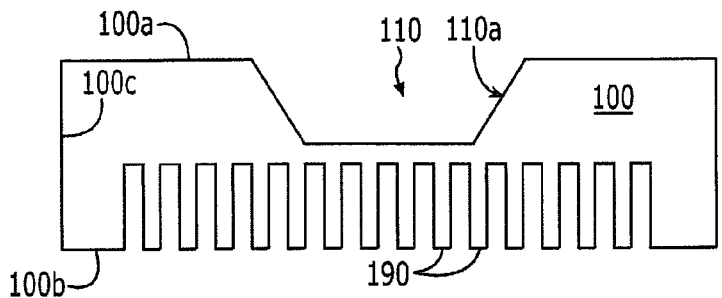
FIGS. 1A-1H are side cross-sectional views of mounting substrates for semiconductor light emitting devices according to various embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower", "base", or "horizontal", and "upper", "top", or "vertical" may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1A-1H are side cross-sectional views of mounting substrates for semiconductor light emitting devices according to various embodiments of the present invention. Referring to FIG. 1A, mounting substrates for semiconductor light emitting devices according to various embodiments of the invention include a solid metal block 100 having a cavity 110 in a first metal face 100a thereof, that is configured to mount a semiconductor light emitting device therein, and to reflect light that is emitted by at least one semiconductor light emitting device that is mounted therein away from the cavity 110. In some embodiments, the solid metal block 100 is a solid aluminum block or a solid steel block. The cavity 110 may be formed by machining, coining, etching and/or other conventional techniques. The size and shape of the cavity 110 may be configured to enhance or optimize the amount and/or direction of light that is reflected away from the cavity 110 from a semiconductor light emitting device that is mounted in the cavity 110. For example, oblique sidewalls 110a and or a semi-ellipsoidal cross-sectional profile may be provided, so as to reflect light that is emitted by at least one semiconductor light emitting device that is mounted therein away from the cavity 110. An additional reflective layer also may be provided on the cavity sidewall and/or floor, as will be described below.

Still referring to FIG. 1A, the second metal face 100b of the solid metal block 100 includes a plurality of heat sink fins 190 therein. The number, spacing and/or geometry of the heat sink fins 190 may be varied for desired heat dissipation, as is well known to those having skill in the art. Moreover, the heat sink fins need not be uniformly spaced, need not be straight, need not be rectangular in cross-section, and can be provided in a one-dimensional elongated array and/or in a two-dimensional array of heat sink fin posts using techniques that are well known to those having skill in the art. Each fin may itself include one or more projecting fins thereon. In some embodiments, the metal block 100 may be a rectangular solid metal block of aluminum or steel about 6 mm×about 9 mm, and about 2 mm thick, and the cavity 110 may be about 1.2 mm deep with a circular floor that is about 2.5 mm in diameter, with sidewalls 110a that are of any simple or complex shape to obtain desired radiation patterns. However, the block 100 may have other polygonal and/or ellipsoidal shapes. Moreover, in some embodiments, an array of 12 heat sink fins 190 may be provided, wherein the heat sink fins have a width of 2 mm, a pitch of 5 mm and a depth of 9 mm. However, many other configurations of heat sink fins 190 may be provided. For example, many heat sink design profiles may be found on the Web at aavid.com.

Figure 1B:
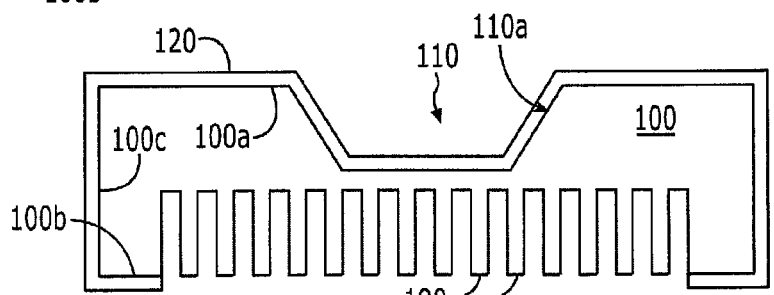

FIG. 1B illustrates mounting substrates according to other embodiments of the present invention. As shown in FIG. 1B, an electrically insulating coating 120 is provided on the surface of the solid metal block 100. The insulating coating 120 may be provided on the entire exposed surface of the solid metal block, including the heat sink fins 190, or excluding the heat sink fins 190 as shown in FIG. 1B, or on only a smaller portion of the exposed surface of the solid metal block. In some embodiments, as will be described below, the insulating coating 120 includes a thin layer of aluminum oxide ($Al_2O_3$) that may be formed, for example, by anodic oxidation of the solid metal block 100 in embodiments where the solid metal block 100 is aluminum. In other embodiments, the insulating coating 120 includes a ceramic coating on a solid steel block 100. In some embodiments, the coating 120 is sufficiently thick to provide an electrical insulator, but is maintained sufficiently thin so as not to unduly increase the thermal conductive path therethrough.

Solid metal blocks 100 of aluminum including thin insulating coatings 120 of aluminum oxide may be provided using substrates that are marketed by the IRC Advanced Film Division of TT Electronics, Corpus Christi, Tex., under the designation Anotherm™, that are described, for example, in brochures entitled Thick Film Application Specific Capabilities and Insulated Aluminium Substrates, 2002, both of which are available on the Web at irctt.com. Moreover, solid metal blocks 100 of steel with an insulating coating 120 of ceramic may be provided using substrates that are marketed by Heatron Inc., Leavenworth, Kans., under the designation ELPOR®, that are described, for example, in a brochure entitled Metal Core PCBs for LED Light Engines, available on the Web at heatron.com. Cavities 110 and heat sink fins 190 may be provided in these solid metal blocks according to any of the embodiments described herein. Other solid metal blocks 100 with insulating coatings 120 may be provided with at least one cavity 110 in a first metal face 100a thereof, and a plurality of heat sink fins 190 in a second metal face 100b thereof in other embodiments of the present invention.

Figure 1C:
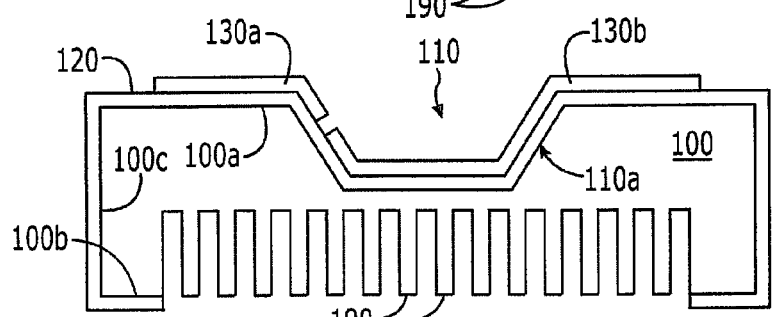

Referring now to FIG. 1C, first and second spaced apart conductive traces 130a, 130b are provided on the insulating coating 120 in the cavity 110. The first and second spaced apart conductive traces 130a, 130b are configured to connect to a semiconductor light emitting device that is mounted in the cavity 110. As shown in FIG. 1C, in some embodiments, the first and second spaced apart conductive traces 130a and 130b can extend from the cavity 110 onto the first face 100a of the solid metal block 100. When the insulating coating 120 is provided on only a portion of the solid metal block 100, it may be provided between the first and second spaced apart traces 130a and 130b and the solid metal block 100, to thereby insulate the first and second metal traces 130a and 130b from the solid metal block 100.

Figure 1D:
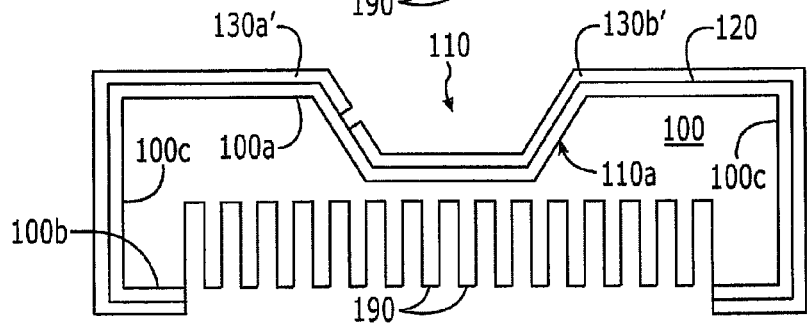

FIG. 1D illustrates other embodiments of the present invention wherein the first and second spaced apart conductive traces 130a', 130b' extend from the cavity 110 to the first face 100a around at least one side 100c of the metal block and onto a second face 100b of the metal block that is opposite the first face 100a. Thus, backside contacts may be provided.

In some embodiments of the invention, the first and second spaced apart conductive traces 130a, 130b and/or 130a', 130b' comprise metal and, in some embodiments, a reflective metal such as silver. Thus, in some embodiments of the present invention, a conductive layer is provided on the insulating layer 120 that is patterned to provide a reflective coating in the cavity 110 and first and second conductive traces 130a, 130b that are configured to connect to at least one semiconductor light emitting device that is mounted in the cavity 110.

Figure 1E:
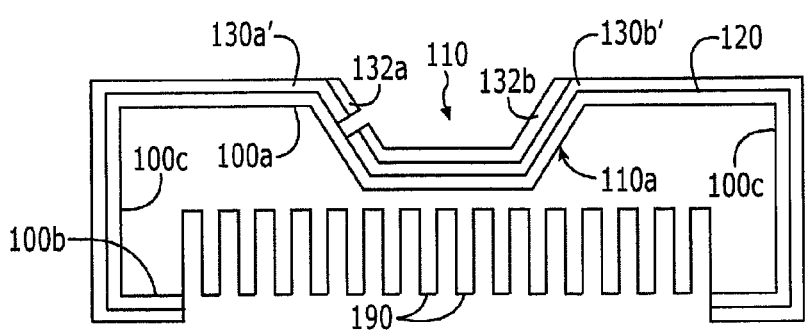

In other embodiments, as shown in FIG. 1E, one or more separate reflective layers 132a, 132b may be provided on the spaced apart conductive traces 130a', 130b' and/or in the cavity 110. In these embodiments, the conductive traces 130a', 130b' may comprise copper, and the reflective layers 132a, 132b may comprise silver. In contrast, in embodiments of FIGS. 1C and/or 1D, the conductive traces may comprise silver to provide an integral reflector.

In still other embodiments, a separate reflector layer need not be provided. Rather, the surface of the cavity 110 including the sidewall 110a may provide sufficient reflectance. Thus, the cavity 110 is configured geometrically to reflect light that is emitted by at least one semiconductor light emitting device that is mounted therein, for example, by providing oblique sidewall(s) 110a, reflective oblique sidewall(s) 110a and/or a reflective coating 132a and/or 132b on the oblique sidewall(s) 110a and/or on the floor of the cavity 110, such that the dimensions and/or sidewall geometry of the cavity act to reflect light that is emitted by at least one semiconductor light emitting device that is mounted in the cavity 110, away from the cavity 110. Reflection may be provided or enhanced by the addition of a reflective coating 132a and/or 132b in the cavity 110.

Figure 1F:
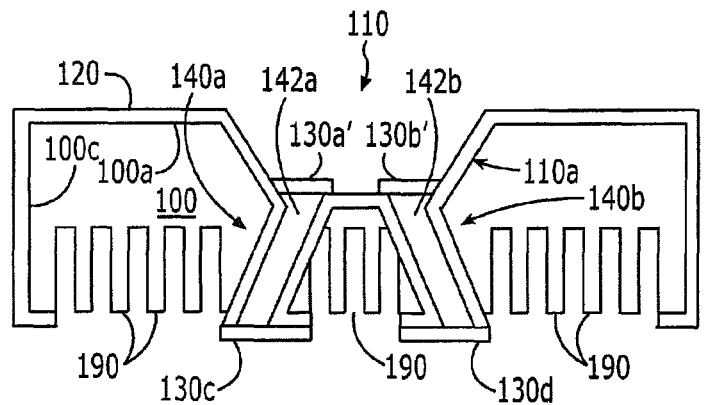

In still other embodiments of the present invention, as illustrated in FIG. 1F, backside contacts may be provided by providing first and/or second through holes 140a and/or 140b, which may be formed in the solid metal block 100 by machining, etching and/or other conventional techniques. Moreover, as shown in FIG. 1F, the insulating coating 120 extends into the through holes 140a and 140b. First and second conductive vias 142a, 142b are provided in the first and second through holes 140a, 140b, and are insulated from the solid metal block 100 by the insulating coating 120 in through holes 140a, 140b.

In FIG. 1F, the through holes 140a and 140b, and the conductive vias 142a and 142b extend from the cavity 110 to the second face 100b. The through holes 140a, 140b may be orthogonal and/or oblique to the first and second faces 100a, 100b. First and second spaced apart conductive traces 130a', 130b' may be provided in the cavity 110, and electrically connected to the respective first and second conductive vias 142a, 142b. On the second face 100b, third and fourth spaced apart conductive traces 130c, 130d also may be provided that are electrically connected to the respective first and second conductive vias 142a, 142b. A solder mask layer may be provided in some embodiments to isolate the third and fourth conductive traces 130c, 130d on the second face 100b, to facilitate circuit board assembly. Solder mask layers are well known to those having skill in the art and need not be described further herein. As shown in FIG. 1F, heat sink fins 190 may be provided in the center and/or at the edges of the solid metal block 100, i.e., adjacent the cavity 110 and/or offset from the cavity 110.

Figure 1G:
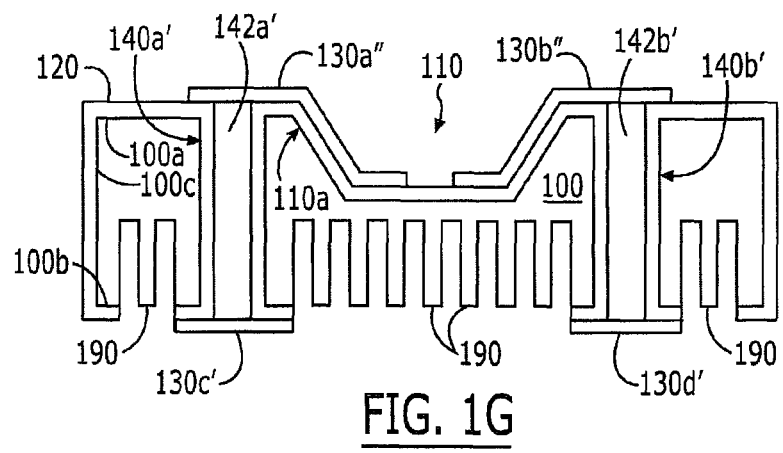

In embodiments of FIG. 1F, the first and second through holes 140a, 140b and the first and second conductive vias 142a, 142b extended from the cavity 110 to the second face 100b. In embodiments of FIG. 1G, the first and second through holes 140a', 140b' and the first and second conductive vias 142a', 142b' extend from the first face 100a outside the cavity 110 to the second face 100b. The through holes 140a', 140b' may be orthogonal and/or oblique to the first and second faces 100a, 100b. First and second spaced apart conductive traces 130a", 130b" extend from the cavity 110 to the respective first and second conductive vias 142a', 142b' on the first face 100a. Third and fourth traces 130c', 130d' are provided on the second face 110b that electrically connect to the respective first and second conductive via 142a', 142b'. As shown in FIG. 1G, heat sink fins 190 may be provided in the center and/or at the edges of the solid metal block 100, i.e., adjacent the cavity 110 and/or offset from the cavity 110.

Figure 1H:
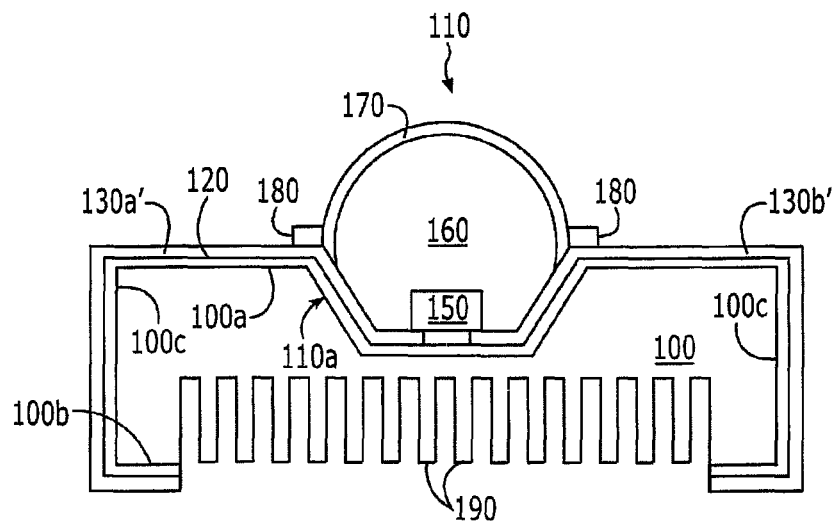

FIG. 1H illustrates embodiments of the invention that were described in connection with FIG. 1D, and which further include a semiconductor light emitting device 150 that is mounted in the cavity and that is connected to the first and second spaced apart electrical traces 130a', 130b'. Moreover, FIG. 1H illustrates that in other embodiments, a lens 170 extends across the cavity. In still other embodiments, an encapsulant 160 is provided between the semiconductor light emitting device 150 and the lens 170. The encapsulant 160 may comprise clear epoxy and can enhance optical coupling from the semiconductor light emitting device 150 to the lens 170. The encapsulant 160 also may be referred to herein as an optical coupling media. In some embodiments, a lens retainer 180 is provided on the solid metal block 100, to hold the lens 170 across the cavity 110. In other embodiments, the lens retainer 180 may not be used.

The semiconductor light emitting device 150 can comprise a light emitting diode, laser diode and/or other device which may include one or more semiconductor layers, which may comprise silicon, silicon carbide, gallium nitride and/or other semiconductor materials, a substrate which may comprise sapphire, silicon, silicon carbide, gallium nitride or other microelectronic substrates, and one or more contact layers which may comprise metal and/or other conductive layers. The design and fabrication of semiconductor light emitting devices are well known to those having skill in the art.

For example, the light emitting device 150 may be gallium nitride based LEDs or lasers fabricated on a silicon carbide substrate such as those devices manufactured and sold by Cree, Inc. of Durham, N.C. For example, the present invention may be suitable for use with LEDs and/or lasers as described in U.S. Pat. Nos. 6,201,262, 6,187,606, 6,120,600, 5,912,477, 5,739,554, 5,631,190, 5,604,135, 5,523,589, 5,416,342, 5,393,993, 5,338,944, 5,210,051, 5,027,168, 5,027,168, 4,966,862 and/or 4,918,497, the disclosures of which are incorporated herein by reference as if set forth fully herein. Other suitable LEDs and/or lasers are described in published U.S. Patent Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Publication No. US 2002/0123164 A1 entitled Light Emitting Diodes Including Modifications for Light Extraction and Manufacturing Methods Therefor. Furthermore, phosphor coated LEDs, such as those described in United States Patent Application No. US 2004/0056260 A1, published on Mar. 25, 2004, entitled Phosphor-Coated Light Emitting Diodes Including Tapered Sidewalls, and Fabrication Methods Therefor, the disclosure of which is incorporated by reference herein as if set forth fully, may also be suitable for use in embodiments of the present invention.

The LEDs and/or lasers may be configured to operate such that light emission occurs through the substrate. In such embodiments, the substrate may be patterned so as to enhance light output of the devices as is described, for example, in the above-cited U.S. Patent Publication No. US 2002/0123164 A1.

It will be understood by those having skill in the art that, although the embodiments of FIGS. 1A-1H have been illustrated as separate embodiments, various elements of FIGS. 1A-1H may be used together to provide various combinations and/or subcombinations of elements. Thus, for example, the reflective layer 132a, 132b may be used in any of the embodiments shown, and the semiconductor light emitting device 150, lens 170, encapsulant 160 and/or the lens retainer 180 may be used in any of the embodiments shown. Accordingly, the present invention should not be limited to the separate embodiments that are shown in FIGS. 1A-1H.

Figure 2:
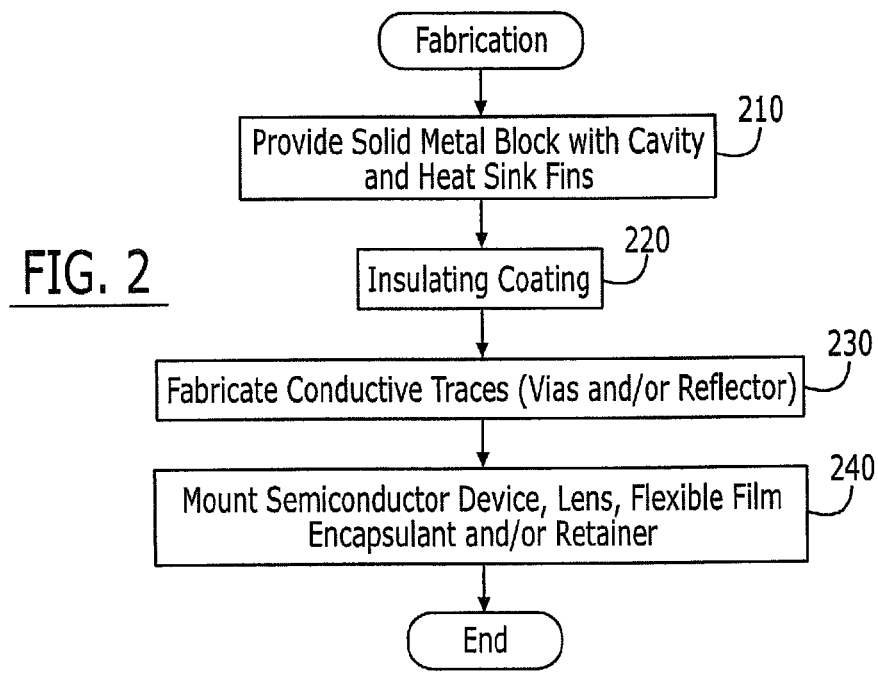
FIG. 2 is a flowchart of steps that may be performed to fabricate mounting substrates for semiconductor light emitting devices according to various embodiments of the present invention.

FIG. 2 is a flowchart of steps that may be performed to package semiconductor light emitting devices according to various embodiments of the present invention. Referring to FIG. 2, as shown at Block 210, a solid block, such as an aluminum or steel block 100 of FIGS. 1A-1H, is provided including a cavity, such as cavity 110, in a face thereof, that is configured to mount a semiconductor light emitting device therein and to reflect light that is emitted by at least one semiconductor light emitting device that is mounted therein away from the cavity 110. The block 100 also includes therein a plurality of heat sink fins 190 on the second face 100b thereof. As was described above, the cavity may be provided by machining, coining, etching and/or other conventional techniques. The heat sink fins 190 may also be provided by these and/or other techniques. Moreover, in other embodiments, the solid metal block may also contain the first and second spaced apart through holes such as through holes 140a, 140b and/or 140a', 140b' that extend therethrough, and which may be fabricated by machining, etching and/or other conventional techniques.

Referring again to FIG. 2, at Block 220, an insulating coating is formed on at least some of the surface of the solid metal block. In some embodiments, a solid aluminum block is oxidized. In other embodiments, a ceramic coating is provided on a solid steel block. Other insulating coatings and other solid metal blocks may be provided. In some embodiments, the entire exposed surface of the solid metal block is coated. Moreover, when through holes are provided, the inner surfaces of the through holes also may be coated. In other embodiments, only portions of the metal block are coated, for example, by providing a masking layer on those portions which are desired not to be coated. Oxidization of aluminum is well known to those having skill in the art and may be performed, for example, using an anodic oxidation processes and/or other oxidation processes, to provide a thin layer of $Al_2O_3$ on the aluminum. Ceramic coatings on steel are also well known to those having skill in the art and need not be described further herein.

Still referring to FIG. 2, at Block 230, first and second spaced apart conductive traces, such as traces 130a, 130b and/or 130a', 130b', are fabricated in the cavity on the first face, on the sides and/or on the second face, depending on the configuration, as was described above. Moreover, in some embodiments, conductive vias, such as vias 142a, 142b and/or 142a', 142b' may be fabricated in through holes. The conductive vias and/or the reflector layer may be fabricated prior to, concurrent with and/or after the conductive traces. The fabrication of conductive traces on a solid metal block that is coated with an insulating layer is well known to provide circuit board-like structures with an aluminum, steel and/or other core, and accordingly need not be described in detail herein.

Finally, at Block 240, other operations are performed to mount the semiconductor device, lens, flexible film encapsulant and/or retainer on the substrate, as described herein. It also will be noted that in some alternate implementations, the functions/acts noted in the blocks of FIG. 2 may occur out of the order noted in the flowchart. For example, two blocks shown in succession may, in fact, be executed substantially concurrently, or the blocks may sometimes be executed in the reverse order, depending upon the functionality/acts involved.

Figure 3A:
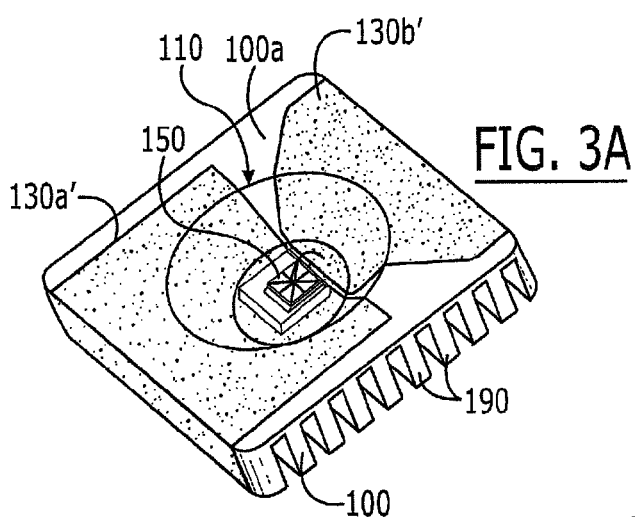
FIGS. 3A and 3B are top and bottom perspective views of a semiconductor light emitting device package according to various embodiments of the present invention.
Figure 3B:
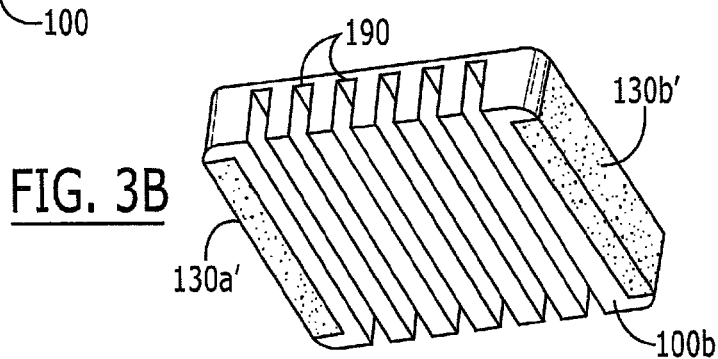

FIGS. 3A and 3B are top and bottom perspective views, respectively, of packages according to embodiments of the present invention, which may correspond to the cross-sectional view of FIG. 1D. FIGS. 3A and 3B illustrate the solid metal block 100, the cavity 110, the fins 190, the first and second spaced apart conductive traces 130a', 130b' that wrap around the solid metal block, and the semiconductor light emitting device 150 mounted in the cavity 110. The insulating coating 120 may be transparent and is not shown. A second insulating layer and/or solder mask may be provided on the first and/or second spaced apart conductive traces in these and/or any other embodiments.

Figure 4:
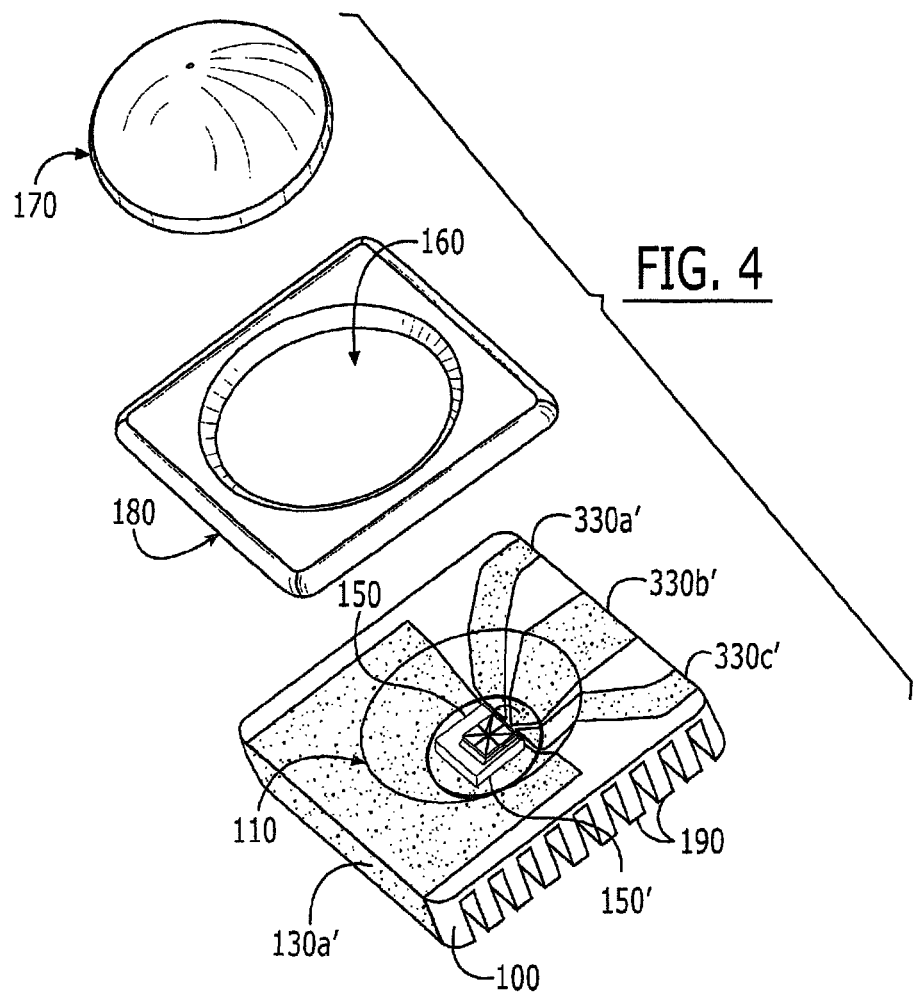
FIG. 4 is an exploded perspective view of a packaged semiconductor light emitting device according to various embodiments of the present invention.
Figure 5:
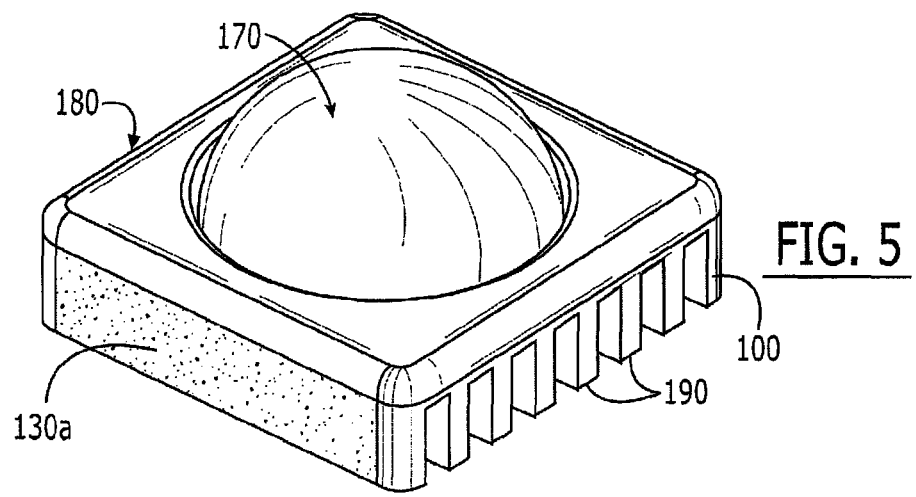
FIG. 5 is an assembled perspective view of a packaged semiconductor light emitting device according to various embodiments of the present invention.

FIG. 4 illustrates an exploded perspective view of other embodiments of the present invention, which may correspond to FIG. 1H. As shown in FIG. 4, the solid metal block 100 includes a cavity 110 therein, and a plurality of spaced apart electrical traces thereon. In FIG. 4, the first electrical trace 130a' is shown. However, rather than a single second electrical trace, a plurality of second electrical traces 330a', 330b' and 330c' may be provided to connect to a plurality of semiconductor light emitting devices 150' that may be mounted in the cavity 110 to provide, for example, red, green and blue semiconductor light emitting devices for a white light source. The encapsulant 160 and lens retainer 180 are shown. Other configurations of lens retainers 180 can provide a ridge and/or other conventional mounting means for mounting a lens 170 on the solid metal block 100. It also will be understood that an epoxy or other glue may be used in a lens retainer 180. The lens retainer 180 may also provide additional top heat sinking capabilities in some embodiments of the present invention. FIG. 5 illustrates the assembled package of FIG. 4.

Accordingly, some embodiments of the present invention use a solid metal block as a mounting substrate for a semiconductor light emitting device and include one or more integral cavities and a plurality of integral heat sink fins. Aluminum or steel have sufficient thermal conductivity to be used as an effective heat sink when integral fins are provided. Additionally, the cost of the material and the cost of fabrication can be low. Moreover, the ability to grow high quality insulating oxides and/or provide ceramic coatings allows the desired electrical traces to be formed without a severe impact on the thermal resistance, since the thickness of the anodic oxidation or other coating can be precisely controlled. This insulating layer also can be selectively patterned, which can allow the addition of another plated metal to the substrate, such as plating silver on the cavity sidewalls only, for increased optical performance.

The ability to form an optical cavity and heat sink fins in the solid metal block, rather than a separate reflector cup and a separate heat sink, can reduce the assembly cost, since the total number of elements for the package can be reduced. Additionally, the fact that the reflector (cavity) position is fixed with respect to the solid metal block can also reduce the assembly complexity. Finally, the integral heat sink fins can enhance thermal efficiency. Embodiments of the invention may be particularly useful for high power semiconductor light emitting devices such as high power LEDs and/or laser diodes.

Other embodiments of solid metal block mounting substrates that may be used according to embodiments of the present invention are described in application Ser. No. 10/659,108, filed Sep. 9, 2003, entitled Solid Metal Block Mounting Substrates for Semiconductor Light Emitting Devices, and Oxidizing Methods For Fabricating Same, assigned to the assignee of the present invention, the disclosure of which is hereby incorporated herein by reference in its entirety as if set forth fully herein.

It is often desirable to incorporate a phosphor into the light emitting device, to enhance the emitted radiation in a particular frequency band and/or to convert at least some of the radiation to another frequency band. Phosphors may be included in a light emitting device using many conventional techniques. In one technique, phosphor is coated inside and/or outside a plastic shell of the device. In other techniques, phosphor is coated on the semiconductor light emitting device itself, for example using electrophoretic deposition. In still other embodiments, a drop of a material such as epoxy that contains phosphor therein may be placed inside the plastic shell, on the semiconductor light emitting device and/or between the device and the shell. LEDs that employ phosphor coatings are described, for example, in U.S. Pat. Nos. 6,252,254; 6,069,440; 5,858,278; 5,813,753; 5,277,840; and 5,959,316.

Some embodiments of the present invention that will now be described provide a coating including phosphor on the lens. In other embodiments, the lens includes phosphor dispersed therein.

FIGS. 6A-6H are cross-sectional views of transmissive optical elements according to various embodiments of the present invention. These optical elements may be used to package semiconductor light emitting devices as will also be described below.

Figure 6A:
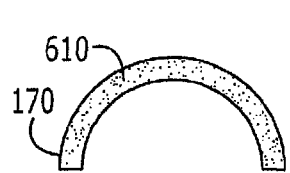
FIGS. 6A-6H are cross-sectional views of transmissive optical elements according to various embodiments of the present invention that may be used with semiconductor light emitting devices.

As shown in FIG. 6A, transmissive optical elements according to some embodiments of the present invention include a lens 170 that comprises transparent plastic. As used herein, the term "transparent" means that optical radiation from the semiconductor light emitting device can pass through the material without being totally absorbed or totally reflected. The lens 170 includes phosphor 610 dispersed therein. As is well mown to those having skill in the art, the lens 170 may comprise polycarbonate material and/or other conventional plastic materials that are used to fabricate transmissive optical elements. Moreover, the phosphor 610 can comprise any conventional phosphor including cerium-doped YAG and/or other conventional phosphors. In some specific embodiments, the phosphor comprises Cerium doped Yttrium Aluminum Garnet (YAG:Ce). In other embodiments, nano-phosphors may be used. Phosphors are well known to those having skill in the art and need not be described further herein.

Figure 6B:
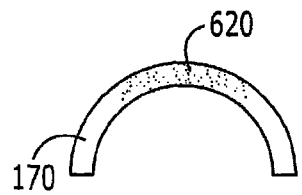

In FIG. 6A, the phosphor 610 is uniformly dispersed within the lens 170. In contrast, in FIG. 6B, the phosphor 620 is nonuniformly dispersed in the lens 170. Various patterns of phosphor 620 may be formed, for example, to provide areas of higher intensity and/or different color and/or to provide various indicia on the lens 170 when illuminated. In FIGS. 6A-6B, the lens 110 is a dome-shaped lens. As used herein, the terms "dome" and "dome-shaped" refer to structures having a generally arcuate surface profile, including regular hemispherical structures as well as other generally arcuate structures that do not form a regular hemisphere, which are eccentric in shape and/or have other features, structures and/or surfaces.

Figure 6C:
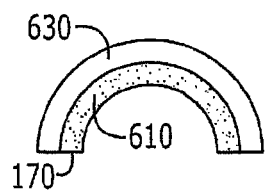
Figure 6D:
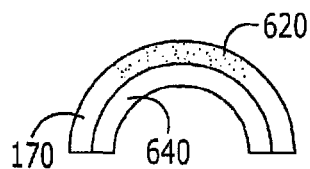

Referring now to FIG. 6C, one or more coatings 630 may be provided on the outside of the lens 170. The coating may be a protective coating, a polarizing coating, a coating with indicia and/or any other conventional coating for an optical element that is well known to those having skill in the art. In FIG. 6D, one or more inner coatings 640 is provided on the inner surface of the lens 170. Again, any conventional coating or combination of coatings may be used.

Moreover, other embodiments of the invention provide both an inner and an outer coating for the lens 170 that includes uniformly distributed phosphor 610 and/or nonuniformly distributed phosphor 620 therein. By providing an inner and outer coating, improved index matching to the phosphor may be provided. Thus, three layers may be injection molded according to some embodiments of the present invention. Other embodiments of the present invention can use an index matching media, such as a liquid and/or solid gel, within the shell, to assist in index matching. The use of inner and outer layers can reduce the number of photons that can be trapped in the phosphor-containing layer due to index matching issues.

Figure 6E:
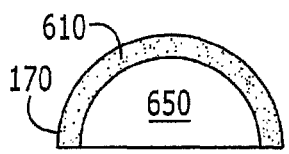

FIG. 6E describes other embodiments of the present invention wherein a transparent inner core 650 is provided inside the lens 170. In some embodiments, as also shown in FIG. 6E, the transparent inner core 650 fills the lens 170, to provide a hemispherical optical element. The transparent inner core 650 may be uniformly transparent and/or may include translucent and/or opaque regions therein. The transparent inner core 650 may comprise glass, plastic and/or other optical coupling media.

Figure 6F:
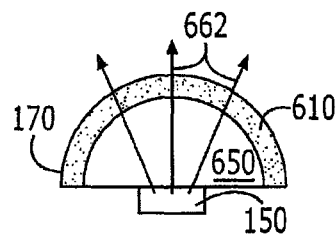

FIG. 6F illustrates other embodiments of the present invention wherein a phosphor-containing lens 170 is combined with a semiconductor light emitting device 150 that is configured to emit light 662 into and through the transparent inner core 650 and through the lens 170, to emerge from the lens 170.

Figure 6G:
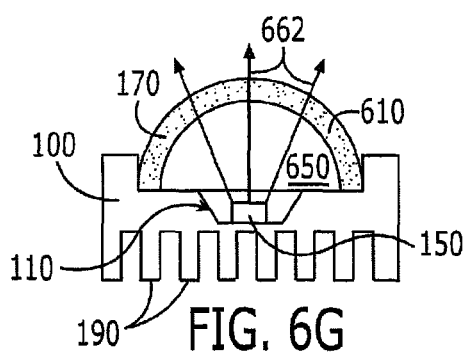

FIG. 6G is a cross-sectional view of other embodiments of the present invention. As shown in FIG. 6G, a mounting substrate 100 is provided, such that the light emitting device 150 is between the mounting substrate 100 and the transparent inner core 650. As also shown in FIG. 6G, the mounting substrate 100 includes a cavity 110 therein and the light emitting device 150 is at least partially in the cavity 110. Heat sink fins 190 also are provided.

Figure 6H:
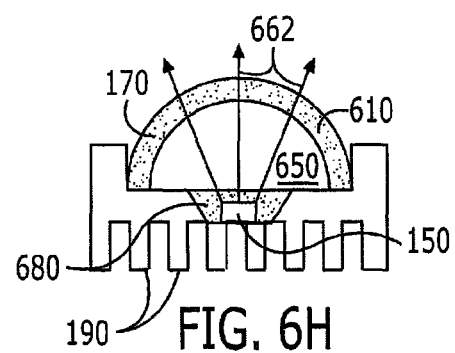

FIG. 6H illustrates yet other embodiments of the present invention. In these embodiments, the cavity 110 may be filled with an encapsulant 680, such as epoxy and/or other optical coupling media (e.g., silicon). The encapsulant 680 can enhance optical coupling from the light emitting device 150 to the transparent inner core 650. Heat sink fins 190 also are provided.

It will be understood by those having skill in the art that, although the embodiments of FIGS. 6A-6H have been illustrated as separate embodiments, various elements of FIGS. 6A-6H may be used together in various combinations and subcombinations of elements. Thus, for example, combinations of inner and outer coatings 640 and 630, uniformly distributed phosphor 610 and nonuniformly distributed phosphor 620, light emitting devices 150, mounting substrates 100, cavities 110, inner cores 650 and encapsulant 680 may be used together. Moreover, embodiments of FIGS. 6A-6H may be combined with any other embodiments disclosed herein.

FIG. 7 is a cross-sectional view of light emitting devices according to other embodiments of the present invention. As shown in FIG. 7, these embodiments include a lens 170 which may be made of optically transparent material that is loaded with phosphor and/or other chemicals. An inner core 650 may be made of optically transparent material such as plastic or glass and may be placed on an encapsulating-containing cavity 110 in a mounting substrate 100 including heat sink fins 190. The lens 170 and the inner core 650 form a composite lens for a light emitting diode 150.

FIG. 8 is a schematic block diagram of an apparatus for forming transmissive optical elements according to various embodiments of the present invention. In particular, FIG. 8 illustrates an injection molding apparatus that may be used to form transmissive optical elements according to various embodiments of the present invention. As shown in FIG. 8, an injection molding apparatus includes a hopper 810 or other storage device in which a transparent plastic and/or phosphor additive 850 are provided. The transparent plastic and/or phosphor additive may be provided in pellet, powder and/or solid form. Other additives, such as solvents, binders, etc. may be included, as is well known to those having skill in the art. An injector 820 may include a heater and a screw mechanism that is used to melt the transparent plastic and phosphor additive and/or maintain these materials in a melted state, to provide a molten liquid that comprises transparent plastic and the phosphor additive. The injector 820 injects the molten liquid into a mold 840 via nozzle 830. The mold 840 includes an appropriate channel 860 therein, which can be used to define the shape of the optical element, such as a dome or keypad key. Injection molding of optical elements is well known to those having skill in the art and is described, for example, in U.S. Pat. Nos. 4,826,424; 5,110,278; 5,882,553; 5,968,422; 6,156,242 and 6,383,417, and need not be described in further detail herein. It also will be understood that casting techniques also may be used, wherein molten liquid that comprises a transparent plastic and a phosphor additive is provided in a female mold which is then coupled to a male mold (or vice versa) to cast the optical element. Casting of optical elements is described, for example, in U.S. Pat. Nos. 4,107,238; 4,042,552; 4,141,941; 4,562,018; 5,143,660; 5,374,668; 5,753,730 and 6,391,231, and need not be described in further detail herein.

FIG. 9 is a flowchart of steps that may be used to package semiconductor light emitting devices according to various embodiments of the present invention. As shown in FIG. 9, at Block 910, a mold, such as mold 840 of FIG. 8, is filled with molten liquid that comprises a transparent plastic and a phosphor additive. At Block 920, the molten liquid is allowed to solidify to produce the optical element having phosphor dispersed therein. The optical element is then removed from the mold and mounted across a cavity in a solid metal block.

FIG. 10 is a flowchart of steps that may be performed to package semiconductor light emitting devices according to embodiments of the present invention. As shown in FIG. 10 at Block 1010, a lens, such as a dome-shaped lens 170, that comprises a transparent plastic including a phosphor dispersed therein, is molded using injection molding, casting and/or other conventional techniques. At Block 1020, a core such as a core 650 of FIG. 6E is formed. It will be understood that, in some embodiments, the core 650 is placed or formed inside the lens 170, whereas, in other embodiments, Block 1020 precedes Block 1010 by forming a transparent core 650 and filling a mold that includes a transparent core 650 with a molten liquid that comprises a transparent plastic and a phosphor additive, to form the lens 170 around the transparent core.

Still referring to FIG. 10, a semiconductor light emitting device, such as device 150, is placed in a reflective cavity 110 of a mounting substrate such as mounting substrate 100. At Block 1040, an encapsulant, such as encapsulant 680 of FIG. 6H, is applied to the mounting substrate 100, the light emitting device 150 and/or the core 650. Finally, at Block 1050, the lens or shell is mated to the mounting substrate using an epoxy, a snap-fit and/or other conventional mounting techniques.

It may be desirable for the inner core 650 to fill the entire lens, so as to reduce or minimize the amount of encapsulant 680 that may be used. As is well known to those having skill in the art, the encapsulant 680 may have a different thermal expansion coefficient than the mounting substrate 100 and/or the inner core 650. By reducing or minimizing the amount of encapsulant 680 that is used at Block 1040, the effect of these thermal mismatches can be reduced or minimized.

It should also be noted that in some alternate implementations, the functions/acts noted in the blocks of FIGS. 9 and/or 10 may occur out of the order noted in the flowcharts. For example, two blocks shown in succession may in fact be executed substantially concurrently or the blocks may sometimes be executed in the reverse order, depending upon the functionality/acts involved.

Accordingly, some embodiments of the present invention can form a composite optical element such as a lens using molding or casting techniques. In some embodiments, injection molding can be used to place a phosphor layer dispersed in the molding material on the inner or outer surface and then completing the molding or casting process in the remaining volume, to form a desired optical element. These optical elements can, in some embodiments, convert a blue light emitting diode behind the lens, to create the appearance of white light.

Other embodiments of the present invention may use the phosphor to evenly disperse the light and/or to disperse the light in a desired pattern. For example, conventional light emitting devices may emit light in a "Batwing" radiation pattern, in which greater optical intensity is provided at off-axis angles, such as angles of about 40° off-axis, compared to on-axis (0°) or at the sides (for example, angles greater than about 40°). Other light emitting diodes may provide a "Lambertian" radiation pattern, in which the greatest intensity is concentrated in a central area to about 40° off-axis and then rapidly drops off at larger angles. Still other conventional devices may provide a side emitting radiation pattern, wherein the greatest light intensity is provided at large angles, such as 90° from the axis, and falls rapidly at smaller angles approaching the axis. In contrast, some embodiments of the present invention can reduce or eliminate angular-dependent radiation patterns of light output from a light emitting device, such as angular dependence of Color Correlated Temperature (CCT). Thus, light intensity and the x,y chromaticity values/coordinates from all surfaces of the lens can remain relatively constant in some embodiments. This may be advantageous when used for illumination applications, such as a room where a spotlight effect is not desirable.

Injection molding processes as described above, according to some embodiments of the invention, can allow formation of a single optical element with multiple features, such as lensing and white conversion. Additionally, by using a two-molding or casting technique, according to some embodiments, one can shape the phosphor layer to its desired configuration, to reduce or minimize the angular dependence of color temperature with viewing angle.

Other embodiments of lenses including phosphor dispersed therein are described in application Ser. No. 10/659,240, filed Sep. 9, 2003, entitled Transmissive Optical Elements Including Transparent Plastic Shell Having a Phosphor Dispersed Therein, and Methods of Fabricating Same, assigned to the assignee of the present invention, the disclosure of which is hereby incorporated by reference in its entirety as if set forth fully herein.

In other embodiments of the present invention, a coating including phosphor is provided on the semiconductor light emitting device 150 itself. In particular, it may be desirable to provide a phosphor for an LED, for example to provide solid-state lighting. In one example, LEDs that are used for solid-state white lighting may produce high radiant flux output at short wavelengths, for example in the range of about 380 nm to about 480 nm. One or more phosphors may be provided, wherein the short wavelength, high energy photon output of the LED is used to excite the phosphor, in part or entirely, to thereby down-convert in frequency some or all of the LED's output to create the appearance of white light.

As one specific example, ultraviolet output from an LED at about 390 nm may be used in conjunction with red, green and blue phosphors, to create the appearance of white light. As another specific example, blue light output at about 470 nm from an LED may be used to excite a yellow phosphor, to create the appearance of white light by transmitting some of the 470 nm blue output along with some secondary yellow emission occurring when part of the LEDs output is absorbed by the phosphor.

Phosphors may be included in a semiconductor light emitting device using many conventional techniques. In one technique, phosphor is coated inside and/or outside the plastic shell of an LED. In other techniques, phosphor is coated on the semiconductor light emitting device itself, for example using electrophoretic deposition. In still other techniques, a drop of a material, such as epoxy that contains phosphor therein, may be placed inside the plastic shell, on the semiconductor light emitting device and/or between the device and the shell. This technique may be referred to as a "glob top". The phosphor coatings may also incorporate an index matching material and/or a separate index matching material may be provided.

Moreover, as was described above, published United States Patent Application No. US 2004/0056260 A1 describes a light emitting diode that includes a substrate having first and second opposing faces and a sidewall between the first and second opposing faces that extends at an oblique angle from the second face towards the first face. A conformal phosphor layer is provided on the oblique sidewall. The oblique sidewall can allow more uniform phosphor coatings than conventional orthogonal sidewalls.

Semiconductor light emitting devices are fabricated, according to other embodiments of the present invention, by placing a suspension comprising phosphor particles suspended in solvent on at least a portion of a light emitting surface of a semiconductor light emitting device, and evaporating at least some of the solvent to cause the phosphor particles to deposit on at least a portion of the light emitting surface. A coating comprising phosphor particles is thereby formed on at least a portion of the light emitting surface.

As used herein, a "suspension" means a two-phase solid-liquid system in which solid particles are mixed with, but undissolved ("suspended"), in liquid ("solvent"). Also, as used herein, a "solution" means a single-phase liquid system in which solid particles are dissolved in liquid ("solvent").

FIG. 11A is a cross-sectional view of a semiconductor light emitting device package during an intermediate fabrication step according to various embodiments of the present invention. As shown in FIG. 11A, a suspension 1120 including phosphor particles 1122 suspended in solvent 1124 is placed on at least a portion of a light emitting surface 150a of a semiconductor light emitting device 150. As used herein, "light" refers to any radiation, visible and/or invisible (such as ultraviolet) that is emitted by a semiconductor light emitting element 150. At least some of the solvent 1124 is then evaporated, as shown by the arrow linking FIGS. 11A and 11B, to cause the phosphor particles 1122 to deposit on at least the portion of the light emitting surface 150a, and form a coating 1130 thereon including the phosphor particles 1122. In some embodiments, the suspension 1120 including phosphor particles 1122 suspended in solvent 1124 is agitated while performing the placing of FIG. 11A and/or while performing the evaporating. Moreover, as shown in FIG. 11B, evaporating can be performed to cause the phosphor particles 122 to uniformly deposit on at least the portion of the light emitting surface 150a, to thereby form a uniform coating 1130 of the phosphor particles 1122. In some embodiments, the phosphor particles 1122 uniformly deposit on all the light emitting surface 150a. Moreover, in some embodiments, substantially all of the solvent 1124 can be evaporated. For example, in some embodiments, at least about 80% of the solvent can be evaporated. In some embodiments, substantially all the solvent 1124 is evaporated to cause the phosphor particles 1122 to uniformly deposit on all the light emitting surface 150a.

In some embodiments of the present invention, the solvent 1124 comprises Methyl Ethyl Ketone (MEK), alcohol, toluene, Amyl Acetate and/or other conventional solvents. Moreover, in other embodiments, the phosphor particles 1122 may be about 3-4 µm in size, and about 0.2 gm of these phosphor particles 1122 may be mixed into about 5cc of MEK solvent 1124, to provide the suspension 1120. The suspension 1120 may be dispensed via an eyedropper pipette, and evaporation may take place at room temperature or at temperatures above or below room temperature, such as at about 60° C. and/or at about 100° C.

Phosphors also are well known to those having skill in the art. As used herein, the phosphor particles 1122 may be Cerium-doped Yttrium Aluminum Garnet (YAG:Ce) and/or other conventional phosphors and may be mixed into the solvent 1124 using conventional mixing techniques, to thereby provide the suspension 1120 comprising phosphor particles 1122. In some embodiments, the phosphor is configured to convert at least some light that is emitted from the light emitting surface 150a such that light that emerges from the semiconductor light emitting device appears as white light.

FIG. 12A is a cross-sectional view of other embodiments of the present invention. As shown in FIG. 12A, a mounting substrate 100 is provided, and the semiconductor light emitting element 150 is mounted in a cavity 110 therein. Heat sink fins 190 also are provided. The suspension 1120 including phosphor particles 1122 suspended in solvent 1124 is placed in the cavity 110. Thus, the cavity 110 can be used to confine the suspension 1120 and thereby provide a controlled amount and geometry for the suspension 1120.

Referring now to FIG. 12B, evaporation is performed, to thereby evaporate at least some of the solvent 1124 to cause the phosphor particles 1122 to deposit on at least a portion of the light emitting surface 150a, and form a coating 1130 including the phosphor particles 1122.

FIGS. 13A and 13B illustrate other embodiments of the present invention. As shown in FIG. 13A, in these embodiments, the cavity 110 includes a cavity floor 110b, and the semiconductor light emitting device 150 is mounted on the cavity floor 110b. Moreover, the semiconductor light emitting device 150 protrudes away from the cavity floor 110b. In some embodiments, the light emitting surface 150a of the semiconductor light emitting device 150 includes a face 150b that is remote from the cavity floor 110b, and a sidewall 150c that extends between the face 150b and the cavity floor 110b. As shown in FIG. 13B, evaporating is performed to evaporate at least some of the solvent 1124, to cause the phosphor particles 1122 to uniformly deposit on at least a portion of the light emitting surface 150a and thereby form a coating 1130 of uniform thickness comprising the phosphor particles 1122. As also shown in FIG. 13B, in some embodiments, the coating may be of uniform thickness on the face 150b and on the sidewall 150c. In some embodiments, the coating 1130 may extend uniformly on the floor 110b outside the light emitting element 150. In other embodiments, the coating 1130 also may extend at least partially onto sidewalls 110a of the cavity 110.

In other embodiments of the present invention, a binder may be added to the suspension 1120 so that, upon evaporation, the phosphor particles 1122 and the binder deposit on at least the portion of the light emitting surface 150a, and form a coating thereon comprising the phosphor particles 1122 and the binder. In some embodiments, a cellulose material, such as ethyl cellulose and/or nitro cellulose, may be used as a binder. Moreover, in other embodiments, at least some of the binder may evaporate along with the solvent.

In other embodiments of the present invention, the suspension 1120 includes the phosphor particles 1122 and light scattering particles suspended in solvent 1124, and wherein at least some of the solvent 1124 is evaporated to cause the phosphor particles 1122 and the light scattering particles to deposit on at least a portion of the light emitting device 150, and form a coating 1130 including the phosphor particles 1122 and the light scattering particles. In some embodiments, the light scattering particles may include $SiO_2$ (glass) particles. By selecting the size of the scattering particles, blue light may be effectively scattered to make the emission source (for white applications) more uniform (more specifically, random), in some embodiments.

It will also be understood that combinations and subcombinations of embodiments of FIGS. 11A-13B also may be provided, according to various embodiments of the invention. Moreover, combinations and subcombinations of embodiments of FIGS. 11A-13B with any or all of the other figures also may be provided according to various embodiments of the invention. Other embodiments of coating a semiconductor light emitting device by evaporating solvents from a suspension are described in application Ser. No. 10/946,587, filed Sep. 21, 2004, entitled Methods of Coating Semiconductor Light Emitting Elements by Evaporating Solvent From a Suspension, assigned to the assignee of the present invention, the disclosure of which is hereby incorporated herein by reference in its entirety as if set forth fully herein. Other embodiments of coating a semiconductor light emitting device by coating a patternable film including transparent silicone and phosphor on a semiconductor light emitting device are described in application Ser. No. 10/947,704, filed Sep. 23, 2004, entitled Semiconductor Light Emitting Devices Including Patternable Films Comprising Transparent Silicone and Phosphor, and Methods of Manufacturing Same, assigned to the assignee of the present invention, the disclosure of which is hereby incorporated herein by reference in its entirety as if set forth fully herein.

Other embodiments of the invention provide a flexible film that includes an optical element therein on the first metal face, wherein the optical element extends across the cavity. In some embodiments, the optical element is a lens. In other embodiments, the optical element may include a phosphor coating and/or may include phosphor dispersed therein.

Figure 14:
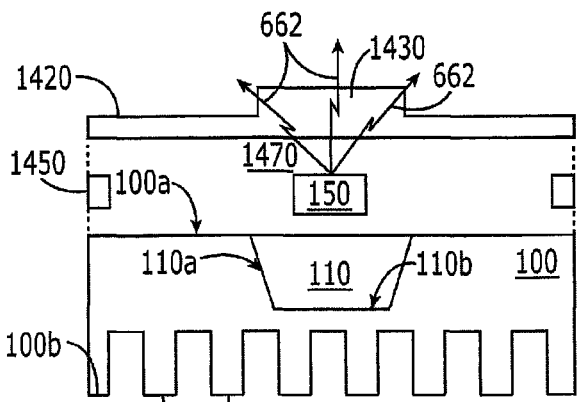
FIG. 14 is an exploded cross-sectional view of a semiconductor light emitting device package and fabrication methods therefor, according to various embodiments of the present invention.

FIG. 14 is an exploded cross-sectional view of semiconductor light emitting device packages and assembling methods therefor, according to various embodiments of the present invention. Referring to FIG. 14, these semiconductor light emitting device packages include a solid metal block 100 having a first face 100a including a cavity 110 therein, and a second face 100b, including a plurality of heat sink fins 190 therein. A flexible film 1420, including therein an optical element 1430, is provided on the first face 100a, and a semiconductor light emitting device 150 is provided between the metal block 100 and the flexible film 1120, and configured to emit light 662 through the optical element. An attachment element 1450 may be used to attach the flexible film 1420 and the solid metal block 100 to one another.

Still referring to FIG. 14, the flexible film 1420 can provide a cover slip that can be made of a flexible material such as a conventional Room Temperature Vulcanizing (RTV) silicone rubber. Other silicone-based and/or flexible materials may be used. By being made of a flexible material, the flexible film 1420 can conform to the solid metal block 100 as it expands and contracts during operations. Moreover, the flexible film 1420 can be made by simple low-cost techniques such as transfer molding, injection molding and/or other conventional techniques that are well known to those having skill in the art.

As described above, the flexible film 1420 includes therein an optical element 1430. The optical element can include a lens, a prism, an optical emission enhancing and/or converting element, such as a phosphor, an optical scattering element and/or other optical element. One or more optical elements 1430 also may be provided, as will be described in detail below. Moreover, as shown in FIG. 14, an optical coupling media 1470, such as an optical coupling gel and/or other index matching material, may be provided between the optical element 1430 and the semiconductor light emitting device 150, in some embodiments.

Still referring to FIG. 14, the attachment element 1450 can be embodied as an adhesive that may be placed around the periphery of the solid metal block 100, around the periphery of the flexible film 1420 and/or at selected portions thereof, such as at the corners thereof. In other embodiments, the solid metal block 100 may be coined around the flexible film 1420, to provide an attachment element 1450. Other conventional attaching techniques may be used.

FIG. 14 also illustrates methods of assembling or packaging semiconductor light emitting devices according to various embodiments of the present invention. As shown in FIG. 14, a semiconductor light emitting element 150 is mounted in a cavity 110 in a first face 100a of a solid metal block 100 that includes fins 190 on a second face 100b thereof. A flexible film 1420 that includes therein an optical element 1430 is attached to the first face 100a, for example using an attachment element 1450, such that, in operation, the semiconductor light emitting device 150 emits light 662 through the optical element 1430. In some embodiments, an optical coupling media 1470 is placed between the semiconductor light emitting device 150 and the optical element 1430.

Figure 15:
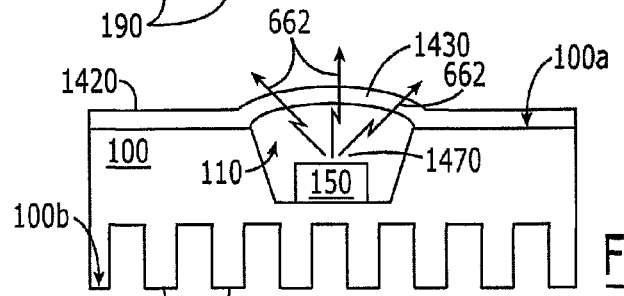
FIGS. 15-25 are cross-sectional views of semiconductor light emitting device packages according to various embodiments of the present invention.

FIG. 15 is a cross-sectional view of packaged semiconductor light emitting devices of FIG. 14, according to other embodiments of the present invention. The flexible film 1420 extends onto the face 100a beyond the cavity 110. The optical element 1430 overlies the cavity 110, and the semiconductor light emitting device 150 is in the cavity 110, and is configured to emit light 662 through the optical element 1430. In FIG. 15, the optical element 1430 includes a concave lens. In some embodiments, an optical coupling media 1470 is provided in the cavity 110 between the optical element 1430 and the semiconductor light emitting device 150. In some embodiments, the optical coupling media 1470 fills the cavity 110.

Figure 16:
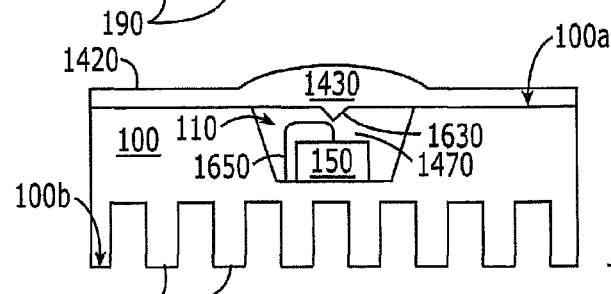

FIG. 16 is a cross-sectional view of other embodiments of the present invention. As shown in FIG. 16, two optical elements 1430 and 1630 are included in the flexible film 1420. A first optical element 1430 includes a lens and a second optical element 1630 includes a prism. Light from the semiconductor light emitting device 150 passes through the prism 1630 and through the lens 1430. An optical coupling media 1470 also may be provided. In some embodiments, the optical coupling media 1470 fills the cavity 110. The optical coupling media 1470 may have a sufficient difference in index of refraction from the prism 1630 such that the prism 1630 can reduce shadowing. As shown in FIG. 16, the semiconductor light emitting device 150 includes a wire 1650 that extends towards the flexible film 1420, and the prism 1630 is configured to reduce shadowing by the wire 1650 of the light that is emitted from the semiconductor light emitting device 150. More uniform light emissions thereby may be provided, with reduced shadowing of the wire 1650. It will be understood that the term "wire" is used herein in a generic sense to encompass any electrical connection for the semiconductor light emitting device 150.

Figure 17:
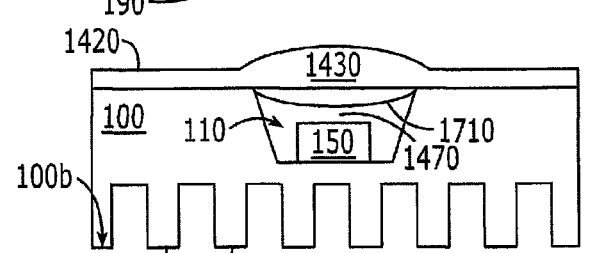

FIG. 17 is a cross-sectional view of other embodiments of the present invention. As shown in FIG. 17, phosphor 1710 is provided on the flexible film 1320 between the lens 1430 and the semiconductor light emitting device 150. The phosphor 410 can include cerium-doped Yttrium Aluminum Garnet (YAG) and/or other conventional phosphors. In some embodiments, the phosphor comprises Cerium doped Yttrium Aluminum Garnet (YAG:Ce). In other embodiments, nano-phosphors may be used. Phosphors are well known to those having skill in the art and need not be described further herein. An optical coupling media 1470 also may be provided that may fill the cavity 110.

Figure 18:
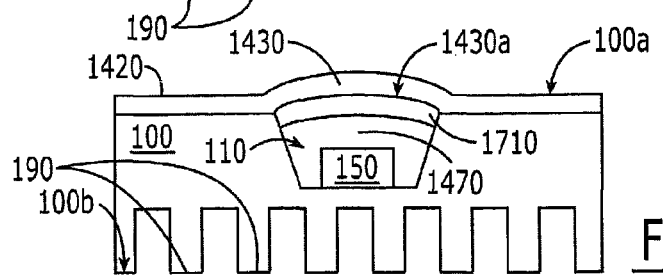

FIG. 18 illustrates yet other embodiments of the present invention. In these embodiments, the lens 1430 includes a concave inner surface 1430a adjacent the semiconductor light emitting device 150, and the phosphor 1710 includes a conformal phosphor layer on the concave inner surface 1430a. An optical coupling media 1470 also may be provided that may fill the cavity 110.

Figure 19:
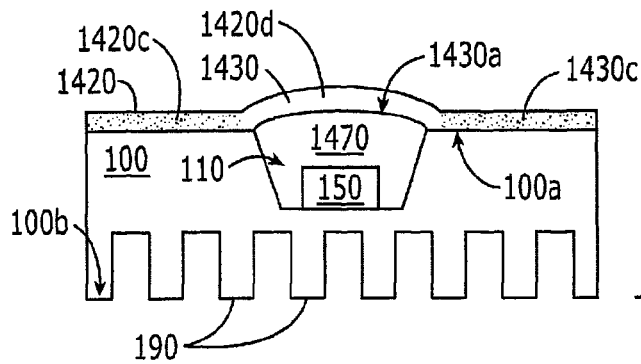

FIG. 19 is a cross-sectional view of other embodiments. As shown in FIG. 19, at least a portion 1420d of the flexible film 1420 that overlies the cavity 110 is transparent to the light. Moreover, at least a portion 1420c of the flexible film 1420 that extends onto the face 100a beyond the cavity 110 is opaque to the light, as shown by the dotted portions 1420c of the flexible film 1420. The opaque regions 1420c can reduce or prevent bouncing of light rays, and thereby potentially produce a more desirable light pattern. An optical coupling media 1470 also may be provided that may fill the cavity 110.

Figure 20:
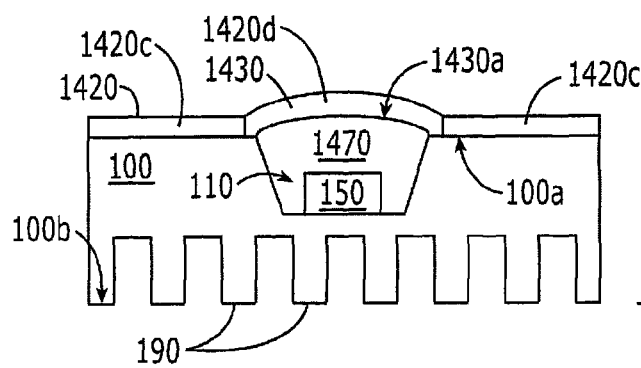

FIG. 20 is a cross-sectional view of other embodiments of the present invention wherein the flexible film 1420 may be fabricated of multiple materials. As shown in FIG. 20, at least a portion 1420d of the flexible film 1420 that overlies the cavity 110 includes a first material, and at least a portion 1420c of the flexible film 1420 that extends onto the face 100a beyond the cavity 110 includes a second material. Two or more materials may be used in the flexible film 1420 in some embodiments, to provide different characteristics for the portion of the flexible film 1420 through which light is emitted and through which light is not emitted. Multiple materials may be used for other purposes in other embodiments. For example, an inflexible and/or flexible plastic lens may be attached to a flexible film. Such a flexible film 1420 with multiple materials may be fabricated using conventional multiple molding techniques, for example. In some embodiments, the first material that is molded may not be fully cured, so as to provide a satisfactory bond that attaches to the second material that is subsequently molded. In other embodiments, the same material may be used for the optical element and the flexible film, wherein the optical element is formed and then the flexible film is formed surrounding the optical element. An optical coupling media 1470 also may be provided that may fill the cavity 110.

Figure 21:
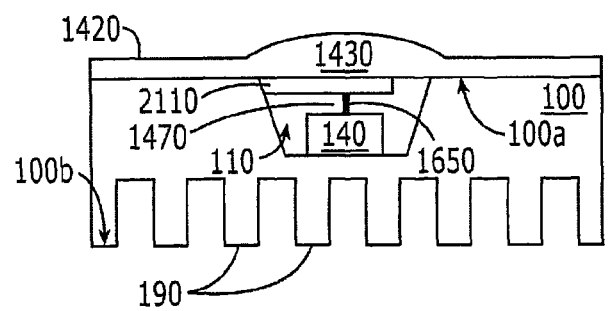

FIG. 21 is a cross-sectional view of other embodiments of the present invention. In these embodiments, the semiconductor light emitting element 150 includes a wire 1650, that extends towards and contacts the flexible film 1420 in the cavity 110. The flexible film 1420 includes a transparent conductor 2110 which can include Indium Tin Oxide (ITO) and/or other conventional transparent conductors. The transparent conductor 2110 extends in the cavity 110 and electrically connects to the wire. Reduced shadowing by the wire 1650 thereby may be provided. Moreover, a wire bond to the metal block 100, and the potential consequent light distortion, may be reduced or eliminated. An optical coupling media 1470 also may be provided that may fill the cavity 110.

Figure 22:
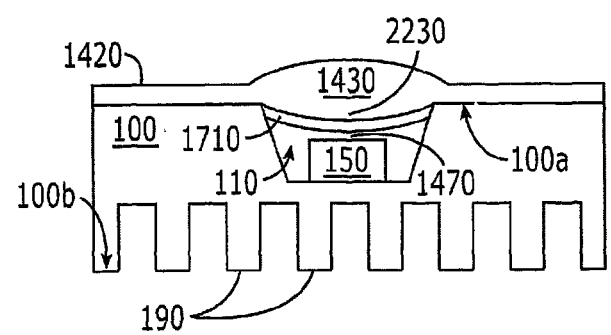

FIG. 22 is a cross-sectional view of other embodiments of the present invention. As shown in FIG. 22, the optical element 1430 includes a lens that overlies the cavity 110 and protrudes away from the cavity 110. The flexible film 1420 further includes a protruding element 2230 between the lens 1430 and the light emitting element 150 that protrudes towards the cavity 110. As shown in FIG. 22, a conformal phosphor layer 1710 is provided on the protruding element 2230. By providing the protruding element 2230 on the back of the lens 1430, optical coupling media 1470 in the device may be displaced. Arrangements of FIG. 22 may thus provide more uniform phosphor coating at desired distances from the light emitting element 150, so as to provide more uniform illumination. The optical coupling media 1470 may fill the cavity 110.

Figure 23:
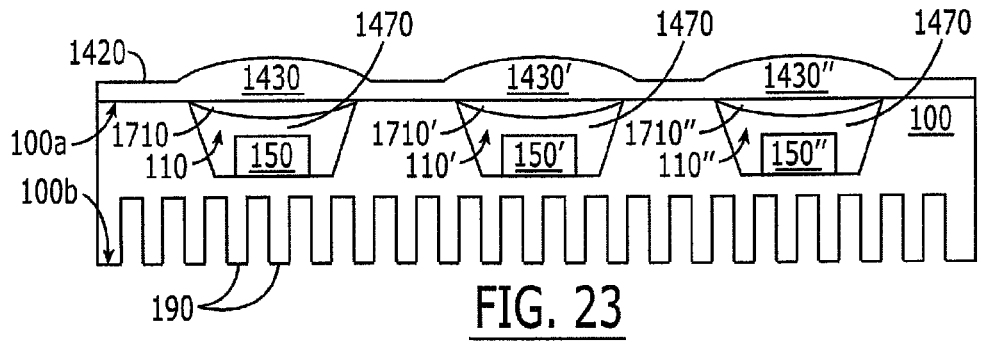
Figure 24:
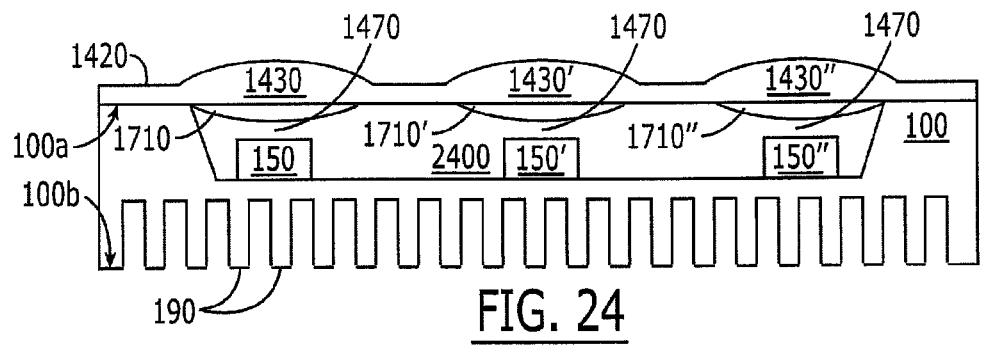

FIGS. 23 and 24 illustrate packages including multiple semiconductor light emitting devices and/or multiple optical elements according to various embodiments of the present invention. For example, as shown in FIG. 23, the optical element 1430 is a first optical element, and the semiconductor light emitting device 150 is a first semiconductor light emitting device. The flexible film 1420 also includes therein a second optical element 1430' that is spaced apart from the first optical element 1430, and the device further includes a second semiconductor light emitting device 150' between the substrate 100 and the flexible film 1420, and configured to emit light through the second optical element 1430'. Moreover, a third optical element 1430" and a third semiconductor light emitting device 150" also may be provided. The optical elements 1430, 1430' and 1430" may be the same and/or different from one another, and the semiconductor light emitting devices 150, 150' and 150" may be the same and/or different from one another. Moreover, in embodiments of FIG. 23, the cavity 110 is a first cavity, and second and third cavities 110', 110", respectively, are provided for the second and third semiconductor light emitting devices 150', 150", respectively. The cavities 110, 110' and 110" may be the same and/or may have different configurations from one another. An optical coupling media 1470 also may be provided that may fill the cavity or cavities. It will be understood that larger or smaller numbers of semiconductor light emitting devices and/or cavities may be provided in other embodiments.

As also shown in FIG. 23, the phosphor 1710 may be a first phosphor layer, and second and/or third phosphor layers 1710' and 1710", respectively, may be provided on the flexible film 1420 between the second optical element 1430' and the second semiconductor light emitting device 150', and between the third optical element 1430" and the third semiconductor light emitting device 150", respectively. The phosphor layers 1710, 1710', 1710" may be the same, may be different and/or may be eliminated. In particular, in some embodiments of the present invention, the first phosphor layer 1710 and the first semiconductor light emitting device 150 are configured to generate red light, the second phosphor layer 1710' and the second semiconductor light emitting device 150' are configured to generate blue light, and the third phosphor layer 1710" and the third semiconductor light emitting device 150" are configured to generate green light. A Red, Green, Blue (RGB) light emitting element that can emit white light thereby may be provided in some embodiments.

FIG. 24 is a cross-sectional view of other embodiments of the present invention. In these embodiments, a single cavity 2400 is provided for the first, second and third semiconductor light emitting devices 150, 150' and 150", respectively. An optical coupling media 1470 also may be provided that may fill the cavity 2400. It will be understood that larger or smaller numbers of semiconductor light emitting devices and/or cavities may be provided in other embodiments.

Figure 25:
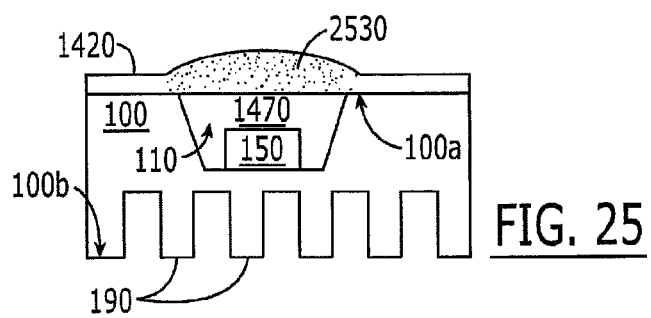

FIG. 25 is a cross-sectional view of yet other embodiments of the present invention. In FIG. 25, the optical element 2530 comprises a lens having phosphor dispersed therein. Many embodiments of lenses including phosphor dispersed therein were described above and need not be repeated. In still other embodiments of the present invention, an optical scattering element may be embedded in the lens as shown in FIG. 25, and/or provided as a separating layer as shown, for example, in FIG. 22, in addition or instead of phosphor.

Figure 26:
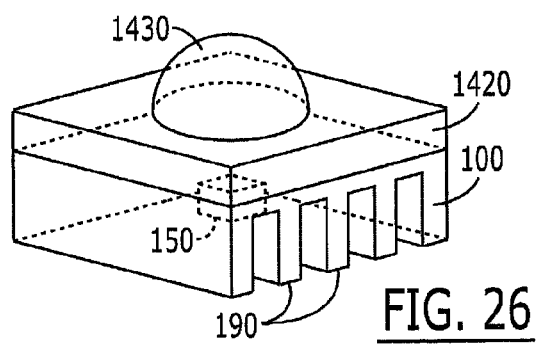
FIG. 26 is a perspective view of a semiconductor light emitting device package according to various embodiments of the present invention.

FIG. 26 is a perspective view of a semiconductor light emitting device package according to other embodiments of the present invention.

It will be understood by those having skill in the art that various embodiments of the invention have been described individually in connection with FIGS. 14-26. However, combinations and subcombinations of the embodiments of FIGS. 14-26 may be provided according to various embodiments of the present invention, and also may be combined with embodiments according to any of the other figures described herein.

Figure 27:
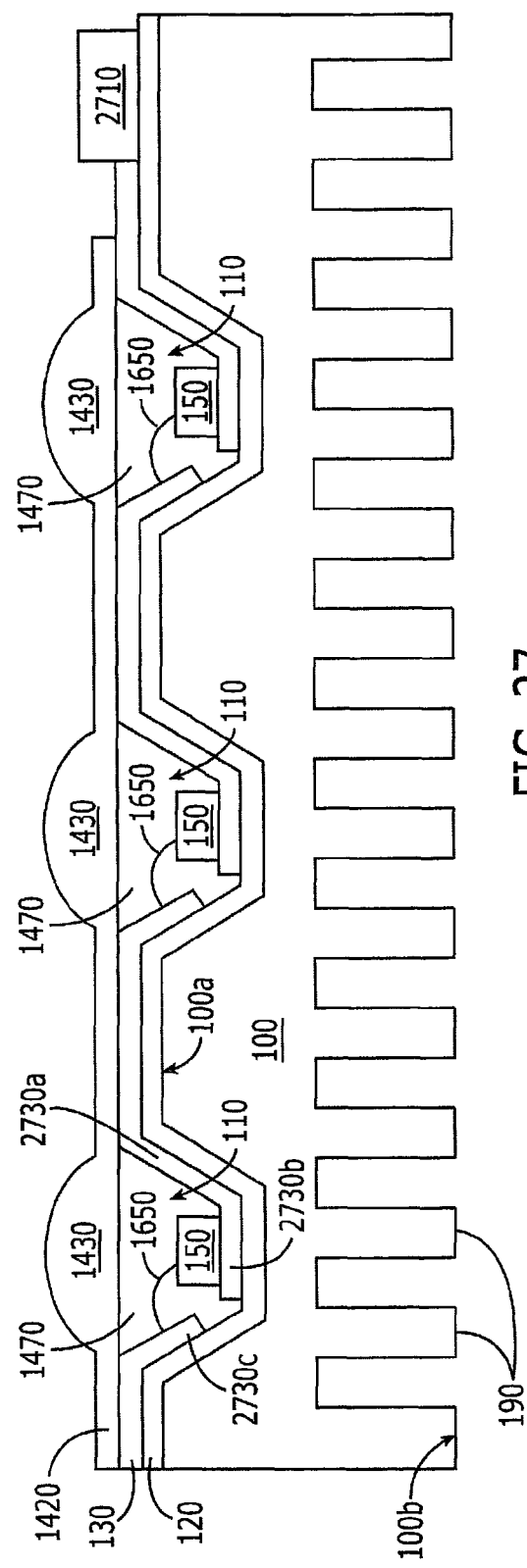
FIG. 27 is a side cross-sectional view of a packaged semiconductor light emitting device according to various embodiments of the present invention.

FIG. 27 is a cross-sectional view of a semiconductor light emitting device package according to various embodiments of the present invention. As shown in FIG. 27, a solid metal block 100 includes a plurality of cavities 110 in a first metal face 100*a* thereof, and a plurality of heat sink fins 190 in a second metal face 100*b* thereof. An insulating layer 120 is provided on the first metal face 100*a*. A conductive layer 130 is provided on the insulating layer, and is patterned to provide a reflective coating 2730*a* in the cavity 110, and first 2730*b* and second 2730*c* conductive traces in the cavity 110 that are configured to connect to at least one semiconductor light emitting device 150 that is mounted in the cavity. As shown in FIG. 27, the traces can provide series connection between the semiconductor light emitting devices. However, parallel and/or series/parallel or anti-parallel connections also may be provided. It will be understood that larger or smaller numbers of semiconductor light emitting devices and/or cavities may be provided in other embodiments.

Still referring to FIG. 27, a flexible film 1420 that includes an optical element 1430 such as a lens therein, is provided on the first metal face 100*a*, wherein a respective optical element 1430 extends across a respective cavity 110. Various embodiments of flexible films 1420 and optical elements 1430 may be provided as was described extensively above. Moreover, phosphor may be integrated as was described extensively above. In other embodiments, discrete lenses 170 also may be provided, instead of the flexible film 1420 containing optical elements 1430. In some embodiments, the conductor 130 is connected to an integrated circuit 2710, such as the light emitting device driver integrated circuit, on the solid metal block 110. In some embodiments, a semiconductor light emitting package of FIG. 27 can be configured to provide a plug-in substitute for a conventional light bulb.

Figure 28:
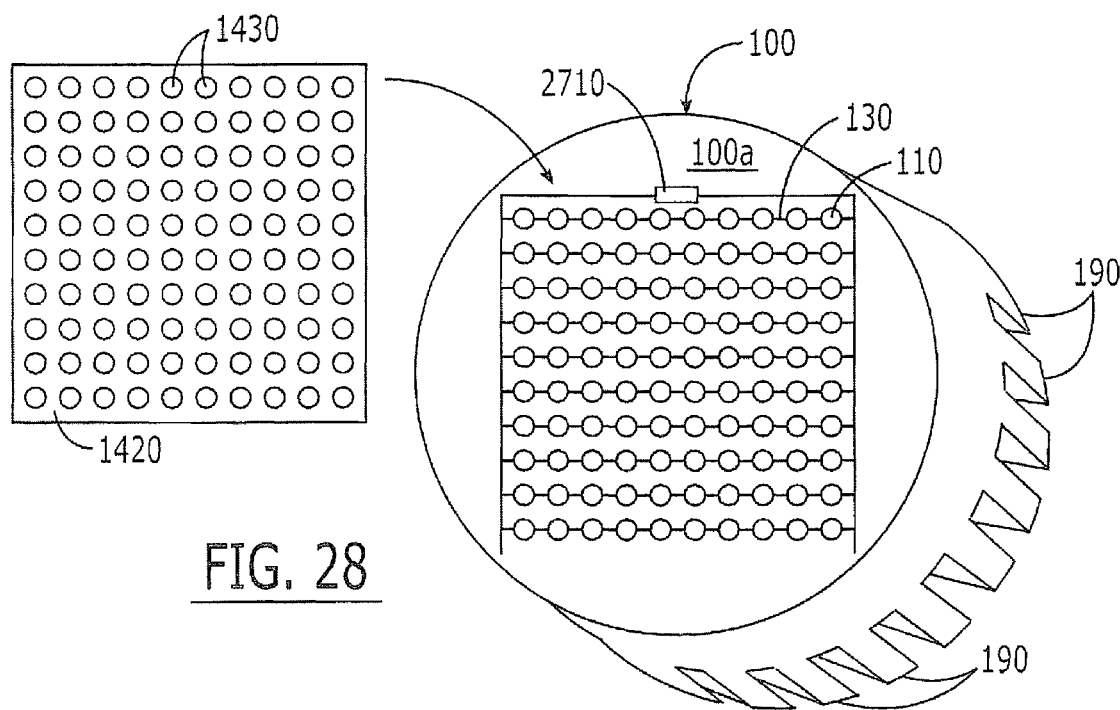
FIG. 28 is a perspective view of FIG. 27.

FIG. 28 is a perspective view of embodiments according to FIG. 27. As shown in FIG. 28, an array of cavities 110 that are connected by a conductive layer 130 may be provided on the first face 100*a* of a solid metal block 100. In FIG. 28, a uniformly spaced 10% 10 array of cavities and a corresponding 10% 10 array of optical elements 1430 on a flexible film 1420, is shown. However, larger or smaller arrays may be provided and the arrays may be circular, randomly spaced and/or of other configuration. Moreover, nonuniform spacing may be provided in some or all portions of the array of cavities 110 and optical elements 1430. More specifically, uniform spacing may promote uniform light output, whereas nonuniform spacing may be provided to compensate for variations in heat dissipation abilities of the heat sink fins 190 across various portions of the solid metal block 100.

It will also be understood that embodiments of FIGS. 27 and 28 may be combined in various combinations and subcombinations with any of the other embodiments described herein.

Figure 29:
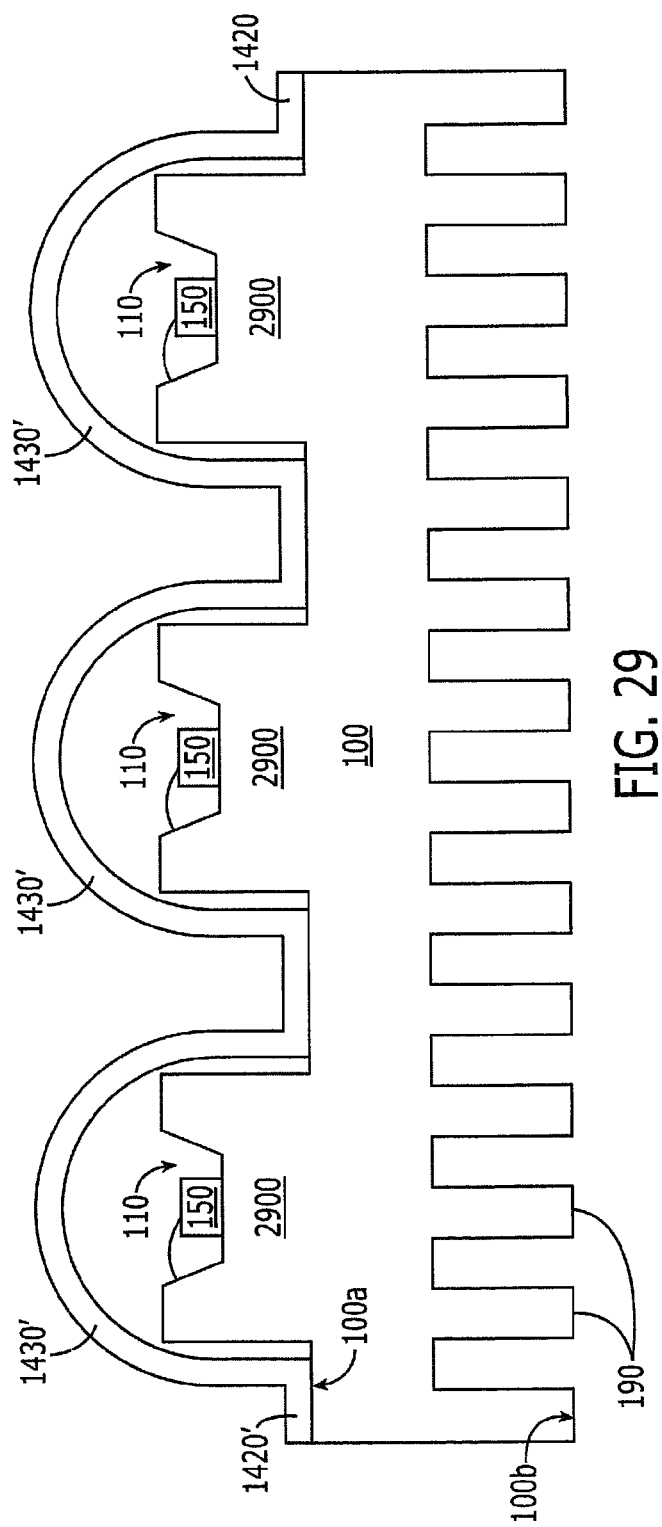
FIG. 29 is a side cross-sectional view of a packaged semiconductor light emitting device according to other embodiments of the present invention.

FIG. 29 is a side cross-sectional view of other embodiments of the present invention. In these embodiments, the first metal face 100*a* further includes a plurality of pedestals 2900 therein, and a respective one of the plurality of cavities 110 is in a respective one of the plurality of pedestals 2900. The insulating layer 120 and conductive layer 130 are not illustrated in FIG. 29 for the sake of clarity. Multiple cavities 110 also may be provided in a given pedestal 2900 in other embodiments. In embodiments of FIG. 29, the flexible film 1420' includes a plurality of optical elements 1430', such as lenses, a respective one of which extends across a respective pedestal 2900 and across a respective cavity 110. It will be understood that larger or smaller numbers of semiconductor light emitting devices and/or cavities may be provided in other embodiments.

By providing pedestals 2900 according to some embodiments of the present invention, the light emitting devices 150 may be placed closer to the radial center of the optical elements 1430', to thereby allow the uniformity of emissions to be enhanced. It will also be understood that embodiments of FIG. 29 may be provided with discrete optical elements, such as lenses, a respective one of which spans across a respective pedestal 2900 and cavity 110, and that embodiments of FIG. 29 may be combined with any combination or subcombination of the other embodiments that were described above.

Figure 30:
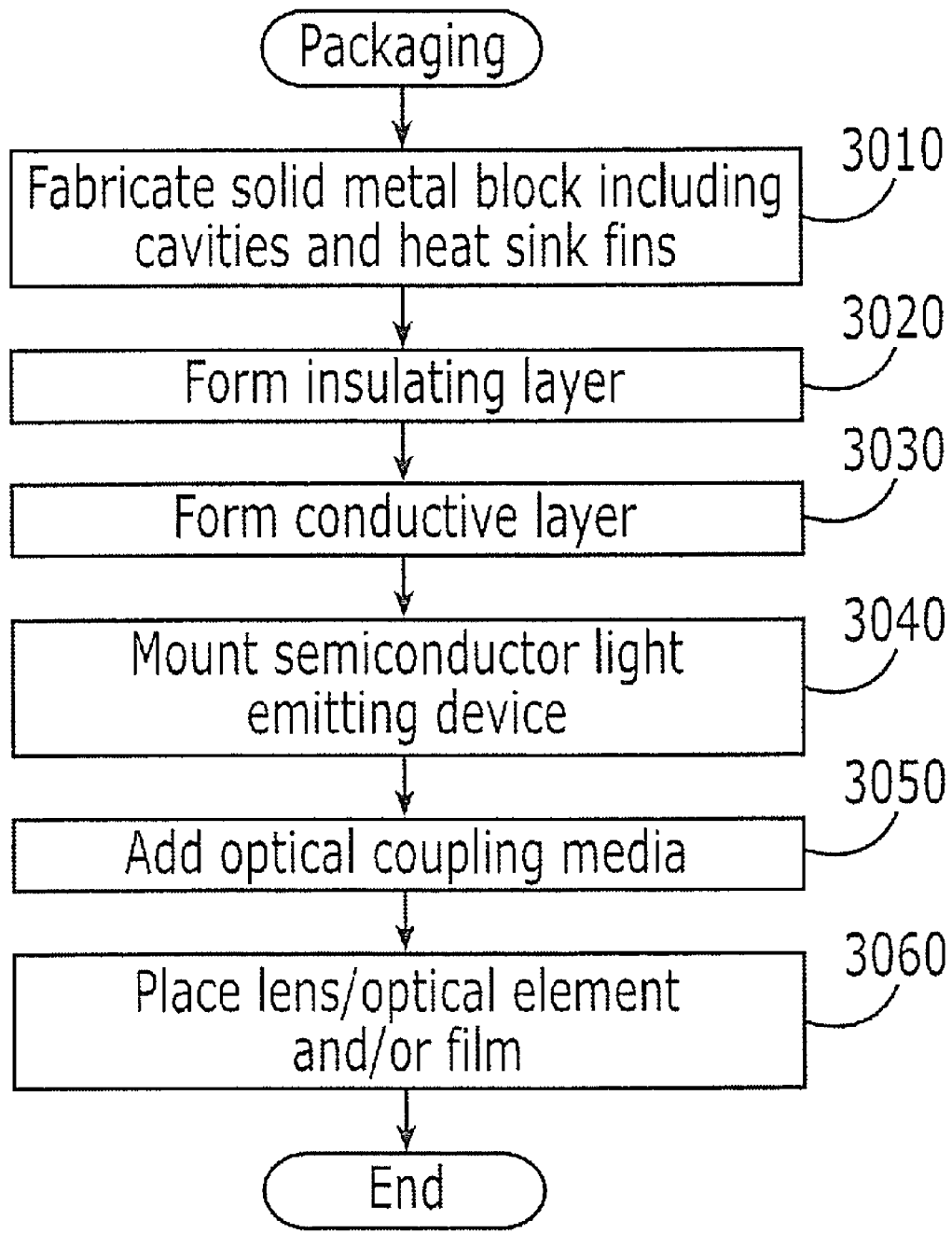
FIG. 30 is a flowchart of steps that may be performed to package semiconductor light emitting devices according to various embodiments of the present invention.

FIG. 30 is a flowchart of steps that may be performed to package semiconductor light emitting devices according to various embodiments of the present invention. Methods of FIG. 30 may be used to package one or more semiconductor light emitting devices, to provide structures that were described in any of the preceding figures.

As shown in FIG. 30 at Block 3010, a solid metal block including cavities and heat sink fins is fabricated, as was described extensively above. An insulating layer is formed on at least a portion of the solid metal block, for example on the first metal face thereof, at Block 3020, as was described extensively above. At Block 3030, a conductive layer is formed on the insulating layer. The conductive layer may be patterned to provide a reflective coating in the cavities, and first and second conductive traces on the first face that extend into the cavities, as was described extensively above. At Block 3040, at least one semiconductor light emitting device is mounted in a respective cavity, and electrically connected to the first and second conductive traces in the respective cavity, as was described extensively above. At Block 3050, an optical coupling medium may be added, as was described above. At Block 3060, a lens, optical element and/or flexible film is placed on the first face, as was described extensively above. In other embodiments, through holes, reflector layers and/or other structures that were described extensively above, also may be provided.

It also will be noted that in some alternate implementations, the functions/acts noted in the blocks of FIG. 30 may occur out of the order noted in the flowchart. For example, two blocks shown in succession may, in fact, be executed substantially concurrently, or the blocks may sometimes be executed in the reverse order, depending upon the functionality/acts involved.

Additional discussion of various embodiments of the present invention now will be provided. Embodiments of the present invention can provide a three-dimensional topside and backside topology on solid metal blocks, to thereby provide integral reflector cavities and integral heat sinks all in one piece. The integrated optical cavities may facilitate alignment and ease of manufacturing. The integral heat sink may enhance thermal efficiency. By adopting a three-dimensional topside topology to form reflectors for the LEDs, the need to individually package the LEDs, mount the package to a heat sink and add the desired drive electronics may be eliminated, according to some embodiments of the present invention. Thus, a "chip on integral reflector heat sink" may be provided as a single component. High optical efficiency and high thermal efficiency thereby may be provided. Adding the drive circuitry can provide a complete solution for a functional luminary that may only need a source voltage and a final luminary housing.

Any shape or density device may be provided. For example, one may desire to have a high lumen intensity (lumen per square millimeter), or one may desire to enhance or optimize the thermal efficiency by distributing the cavity layout. A high density embodiment may have four high power LEDs such as are marketed under the designation XB900 by Cree, Inc., the assignee of the present invention, to provide a 2% 2 array, while a distributed thermal approach may have 100 lower power LEDs, such as are marketed under the designation XB290 by Cree, Inc., the assignee of the present invention, to provide a 10% 10 array, to achieve the same lumen output. The XB900 and XB290 devices are described in a product brochure entitled Cree Optoelectronics LED Product Line, Publication CPR3AX, Rev. D, 2001-2002. Other devices that are described in this product brochure, such as XT290, XT230 and/or other devices from other manufacturers also may be used.

As was described above, the optical cavities may be either recessed or may be provided as optical cavities in pedestals. The conductive layer can provide die-attach pads and wire bond pads. Separate traces may be provided for red, green or blue LEDs, or all the LEDs may be connected in series or in parallel.

Embodiments of the present invention can provide a configuration that may be able to replace a standard MR16 or other light fixture. In some embodiments, 6.4 watts input may provide about 2.4 watts of optical power and 4 watts of heat dissipation.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A mounting substrate for a semiconductor light emitting device comprising:
    a solid metal block including first and second opposing metal faces;
    an insulating layer on the first metal face;
    a conductive layer on the insulating layer that is patterned to provide first and second conductive traces on the first metal face;
    at least one semiconductor light emitting device that is mounted on the first metal face and electrically connected to the first and second conductive traces;
    a flexible film that includes an optical element therein on the first metal face, the flexible film extending adjacent the at least one semiconductor light emitting device, so that the at least one semiconductor light emitting device is between the optical element and the first metal face, and further extending on the first metal face beyond the at least one semiconductor light emitting device;
    wherein the flexible film includes opposing faces on the first metal face beyond the at least one semiconductor light emitting device, that both conform to the first metal face beyond the at least one semiconductor light emitting device;
    wherein the flexible film further includes opposing faces adjacent the at least one semiconductor light emitting device, that both conform to a surface of an underlying layer;
    an attachment element that attaches the flexible film to the first metal face beyond the at least one semiconductor light emitting device, so that the optical element is unattached from the at least one semiconductor light emitting device; and
    the second metal face including therein a plurality of metal heat sink fins.

2. A mounting substrate according to claim 1 wherein the solid metal block comprises a solid aluminum block and wherein the insulating layer comprises aluminum oxide.

3. A mounting substrate according to claim 1 wherein the solid metal block comprises a solid steel block and wherein the insulating layer comprises ceramic.

4. A mounting substrate according to claim 1 wherein the solid metal block includes a through hole therein that extends from the first face to the second face and wherein the through hole includes a conductive via therein that is electrically connected to the first or second conductive traces.

5. A mounting substrate according to claim 1 wherein the optical element comprises a lens.

6. A mounting substrate according to claim 5 in further combination with a coating comprising phosphor on the lens, the coating comprising phosphor including opposing surfaces that both conform to a contour of the lens.

7. A mounting substrate according to claim 5 wherein the lens includes phosphor dispersed therein.

8. A mounting substrate according to claim 1 further comprising an integrated circuit on the solid metal block that is electrically connected to the first and second conductive traces.

9. A mounting substrate according to claim 1 further comprising a semiconductor light emitting device driver integrated circuit on the solid metal block that is electrically connected to the first and second conductive traces.

10. A mounting substrate for a semiconductor light emitting device comprising:
    a solid block including first and second opposing faces;
    a conductive layer on the first face that is patterned to provide first and second conductive traces on the first face;
    at least one semiconductor light emitting device that is mounted on the first face and electrically connected to the first and second conductive traces;
    a flexible film that includes an optical element therein on the first face, the flexible film extending adjacent the at least one semiconductor light emitting device so that the at least one semiconductor light emitting device is between the optical element and the first face, and further extending on the first face beyond the at least one semiconductor light emitting device;

wherein the flexible film includes opposing faces on the first face beyond the at least one semiconductor light emitting device, that both conform to the first face beyond the at least one semiconductor light emitting device;

wherein the flexible film further includes opposing faces adjacent the at least one semiconductor light emitting device, that both conform to a surface of an underlying layer; and an attachment element that attaches the flexible film to the first face beyond the at least one semiconductor light emitting device, so that the optical element is unattached from the at least one semiconductor light emitting device.

11. A mounting substrate according to claim 10 wherein the solid block comprises a solid aluminum block.

12. A mounting substrate according to claim 10 wherein the solid block comprises a solid steel block.

13. A mounting substrate according to claim 10 wherein the solid block includes a through hole therein that extends from the first face to the second face and wherein the through hole includes a conductive via therein that is electrically connected to the first or second conductive traces.

14. A mounting substrate according to claim 10 wherein the optical element comprises a lens.

15. A mounting substrate according to claim 14 in further combination with a coating comprising phosphor on the lens, the coating comprising phosphor including opposing surfaces that both conform to a contour of the lens.

16. A mounting substrate according to claim 14 wherein the lens includes phosphor dispersed therein.

17. A mounting substrate according to claim 14 wherein the second face includes therein a plurality of metal heat sink fins.

18. A mounting substrate according to claim 10 further comprising a semiconductor light emitting device driver integrated circuit on the solid block that is electrically connected to the first and second conductive traces.

19. A mounting substrate according to claim 1 wherein the attachment element is located around a periphery of the flexible film.

20. A mounting substrate according to claim 1 wherein the attachment element is located at corners of the flexible film, but not between the corners of the flexible film.

21. A mounting substrate according to claim 1 wherein the attachment element comprises adhesive.

22. A mounting substrate according to claim 10 wherein the attachment element is located around a periphery of the flexible film.

23. A mounting substrate according to claim 10 wherein the attachment element is located at corners of the flexible film, but not between the corners of the flexible film.

24. A mounting substrate according to claim 10 wherein the attachment element comprises adhesive.

25. A mounting substrate according to claim 1 wherein the flexible film is a conformal flexible film.

26. A mounting substrate according to claim 1 wherein the flexible film is of uniform thickness on the first metal face beyond the at least one semiconductor light emitting device.

27. A mounting substrate according to claim 10 wherein the flexible film is a conformal flexible film.

28. A mounting substrate according to claim 10 wherein the flexible film is of uniform thickness on the first face beyond the at least one semiconductor light emitting device.

* * * * *